(12) United States Patent
Defranco et al.

(10) Patent No.: US 10,854,854 B2
(45) Date of Patent: Dec. 1, 2020

(54) PHOTOLITHOGRAPHIC PATTERNING OF ORGANIC ELECTRONIC DEVICES

(71) Applicant: ORTHOGONAL, INC., Rochester, NY (US)

(72) Inventors: John Andrew Defranco, Rochester, NY (US); Terrence Robert O'Toole, Webster, NY (US); Frank Xavier Byrne, Webster, NY (US); Diane Carol Freeman, Pittsford, NY (US)

(73) Assignee: Orthogonal, Inc., Rochester, NY (US)

( * ) Notice: Subject to any disclaimer, the term of this patent is extended or adjusted under 35 U.S.C. 154(b) by 0 days.

(21) Appl. No.: 16/575,973

(22) Filed: Sep. 19, 2019

(65) Prior Publication Data

US 2020/0013993 A1 Jan. 9, 2020

Related U.S. Application Data

(63) Continuation of application No. 15/867,019, filed on Jan. 10, 2018, now Pat. No. 10,468,637, which is a
(Continued)

(51) Int. Cl.
*H01L 21/00* (2006.01)
*H01L 29/08* (2006.01)
(Continued)

(52) U.S. Cl.
CPC .......... *H01L 51/56* (2013.01); *H01L 27/3211* (2013.01); *H01L 27/3218* (2013.01);
(Continued)

(58) Field of Classification Search
CPC . H01L 51/56; H01L 27/3211; H01L 27/3218; H01L 51/0016; H01L 51/0018;
(Continued)

(56) References Cited

U.S. PATENT DOCUMENTS

| 4,720,432 A | 1/1988 | VanSlyke et al. |
| 5,776,623 A | 7/1998 | Hung et al. |

(Continued)

FOREIGN PATENT DOCUMENTS

| EP | 0 924 245 | 6/1999 |
| EP | 2 784 839 A1 | 10/2014 |

(Continued)

OTHER PUBLICATIONS

International Search Report for corresponding International Patent Application No. PCT/US2015/043168 dated Dec. 15, 2015, 2 pgs.
(Continued)

*Primary Examiner* — Alonzo Chambliss
(74) *Attorney, Agent, or Firm* — Merchant & Gould P.C.

(57) ABSTRACT

A method of making an OLED device includes providing a first undercut lift-off structure over the device substrate having a first array of bottom electrodes. Next, one or more first organic EL medium layers including at least a first light-emitting layer are deposited over the first undercut lift-off structure and over the first array of bottom electrodes. The first undercut lift-off structure and overlying first organic EL medium layer(s) are removed by treatment with a first lift-off agent comprising a fluorinated solvent to form a first intermediate structure. The process is repeated using a second undercut lift-off structure to deposit one or more second organic EL medium layers over a second array of bottom electrodes. After removal of the second undercut lift-off structure, a common top electrode is provided in electrical contact with the first and second organic EL medium layers.

9 Claims, 17 Drawing Sheets

US 10,854,854 B2
Page 2

Related U.S. Application Data continuation of application No. 15/501,092, filed as application No. PCT/US2015/043168 on Jul. 31, 2015, now Pat. No. 9,899,636.

(60) Provisional application No. 62/031,888, filed on Aug. 1, 2014.

(51) Int. Cl.
| | |
|---|---|
| *H01L 51/56* | (2006.01) |
| *H01L 51/00* | (2006.01) |
| *H01L 27/32* | (2006.01) |
| *H01L 51/52* | (2006.01) |
| *H01L 51/50* | (2006.01) |

(52) U.S. Cl.
CPC ...... *H01L 27/3274* (2013.01); *H01L 51/0016* (2013.01); *H01L 51/0018* (2013.01); *H01L 51/0032* (2013.01); *H01L 51/5016* (2013.01); *H01L 51/5056* (2013.01); *H01L 51/5072* (2013.01); *H01L 51/5092* (2013.01); *H01L 51/5096* (2013.01); *H01L 51/5203* (2013.01); *H01L 51/5296* (2013.01)

(58) Field of Classification Search
CPC ............. H01L 51/5016; H01L 51/5056; H01L 51/5072; H01L 51/5092; H01L 51/5096; H01L 2251/50; H01L 51/5296; H01L 51/0032; H01L 27/3274; H01L 2227/32; H01L 51/5203
See application file for complete search history.

(56) References Cited

U.S. PATENT DOCUMENTS

| | | | |
|---|---|---|---|
| 6,013,538 A | 1/2000 | Burrows et al. | |
| 6,208,075 B1 | 3/2001 | Hung et al. | |
| 6,720,573 B2 | 4/2004 | Son et al. | |
| 7,684,868 B2 | 3/2010 | Tai et al. | |
| 7,830,080 B2 | 11/2010 | Tanada | |
| 7,955,719 B2 | 6/2011 | Hatwar et al. | |
| 8,106,582 B2 | 1/2012 | Yamamichi et al. | |
| 8,587,003 B2 | 11/2013 | Ando | |
| 8,846,301 B2 | 9/2014 | Ober et al. | |
| 9,034,736 B2 | 5/2015 | Sirringhaus et al. | |
| 9,054,341 B2 | 6/2015 | Kim et al. | |
| 9,091,913 B2 | 7/2015 | Katz et al. | |
| 9,104,104 B2 | 8/2015 | Wright et al. | |
| 9,298,088 B2 | 3/2016 | Robello et al. | |
| 9,500,948 B2 | 11/2016 | Wright et al. | |
| 9,541,829 B2 | 1/2017 | Robello et al. | |
| 9,806,099 B2 | 10/2017 | Yamazaki et al. | |
| 9,899,636 B2 | 2/2018 | DeFranco et al. | |
| 9,941,309 B2 | 4/2018 | Yamazaki et al. | |
| 10,468,637 B2 * | 11/2019 | Defranco | H01L 51/0018 |
| 10,503,074 B2 * | 12/2019 | Defranco | G03F 7/094 |
| 10,580,987 B2 * | 3/2020 | DeFranco | G03F 7/0046 |
| 2004/0211956 A1 | 10/2004 | Kanno et al. | |
| 2005/0153058 A1 | 7/2005 | Tachikawa et al. | |
| 2008/0124824 A1 | 5/2008 | Tsai et al. | |
| 2010/0193778 A1 | 8/2010 | An et al. | |
| 2010/0289019 A1 | 11/2010 | Katz et al. | |
| 2011/0101317 A1 | 5/2011 | Gregory et al. | |
| 2011/0159252 A1 | 6/2011 | Ober et al. | |
| 2011/0309389 A1 | 12/2011 | Yu et al. | |
| 2012/0252149 A1 | 10/2012 | Hiroki et al. | |
| 2012/0305897 A1 | 12/2012 | Ober et al. | |
| 2013/0075768 A1 | 3/2013 | Kim et al. | |
| 2013/0084664 A1 | 4/2013 | Yoshitoku et al. | |
| 2013/0126833 A1 | 5/2013 | Endo et al. | |
| 2013/0137205 A1 | 5/2013 | Moriyama et al. | |
| 2014/0127625 A1 | 5/2014 | Defranco et al. | |
| 2014/0154827 A1 | 6/2014 | Lee et al. | |
| 2014/0197378 A1 | 7/2014 | Lecloux et al. | |
| 2014/0197379 A1 | 7/2014 | Li | |
| 2014/0319499 A1 | 10/2014 | Yamazaki et al. | |
| 2014/0322656 A1 | 10/2014 | Wright et al. | |
| 2014/0356789 A1 | 12/2014 | Wright et al. | |
| 2015/0090976 A1 | 4/2015 | Zakhidov et al. | |
| 2015/0132699 A1 | 5/2015 | Robello et al. | |
| 2015/0140729 A1 | 5/2015 | Ferro et al. | |
| 2016/0027763 A1 | 1/2016 | Cope | |
| 2016/0049518 A1 | 2/2016 | Endo | |
| 2016/0164040 A1 | 6/2016 | Kurata et al. | |
| 2017/0236849 A1 | 8/2017 | Endo | |

FOREIGN PATENT DOCUMENTS

| | | | |
|---|---|---|---|
| WO | 02/04534 | A1 | 1/2002 |
| WO | 2011/015808 | A1 | 2/2011 |
| WO | 2011/139771 | A1 | 11/2011 |
| WO | 2011/139774 | A2 | 11/2011 |
| WO | 2012/118713 | A2 | 9/2012 |
| WO | 2012/143817 | A2 | 10/2012 |
| WO | 2012/148884 | A2 | 11/2012 |
| WO | 2013/074622 | A1 | 5/2013 |
| WO | 2014/053202 | A1 | 4/2014 |
| WO | 2015/013396 | A1 | 1/2015 |
| WO | 2015/028407 | A1 | 3/2015 |
| WO | 2015/120025 | A1 | 8/2015 |
| WO | 2016/019210 | A1 | 2/2016 |
| WO | 2016/019212 | A1 | 2/2016 |
| WO | 2016/019277 | A1 | 2/2016 |

OTHER PUBLICATIONS

Krotkus, S. et al., "Influence of bilayer processing on p-i-n OLEDs: towards multicolor photolithographic structuring of organic displays", Proc. of SPIE, 9360: 93600W-1-93600W-10 (2015).
Krotkus, S. et al., "Photo-patterning of Highly Efficient State-of-the-Art Phosphorescent OLEDs Using Orthogonal Hydrofluoroethers", Adv. Optical Mater., 2(11): 1043-1048 (2014).
LOR and PMGI Resists, MicroChem Data Sheet, 7 pages (2006).
Malinowski, P. et al., "True-Color 640 ppi OLED Arrays Patterned by CA i-line Photolithography", SID 2015 Digest, 215-218 (2015).
Sakanoue, T. et al., "Fluorosurfactant-assisted photolithography for patterning of perfluoropolymers and solution-processed organic semiconductors for printed displays", Applied Physics Express, 7: 101602-1-101602-4 (2014).
Yamamoto, H. et al., "Understanding Extrinsic Degradation in Phosphorescent OLEDs", SID 2014 Digest, 758-761 (2014).
Extended European Search Report for European Patent Application No. 15828065.1 dated Jun. 19, 2018, 11 pages.

\* cited by examiner

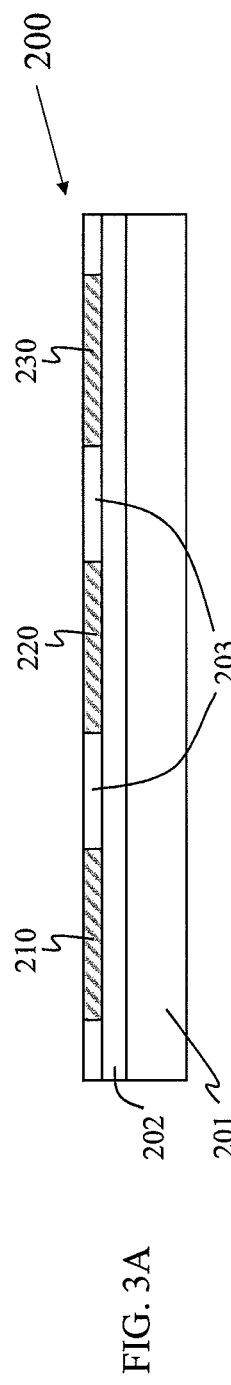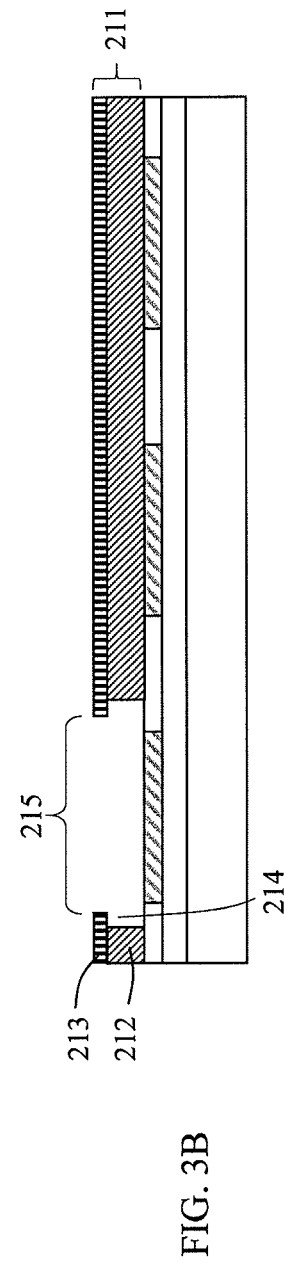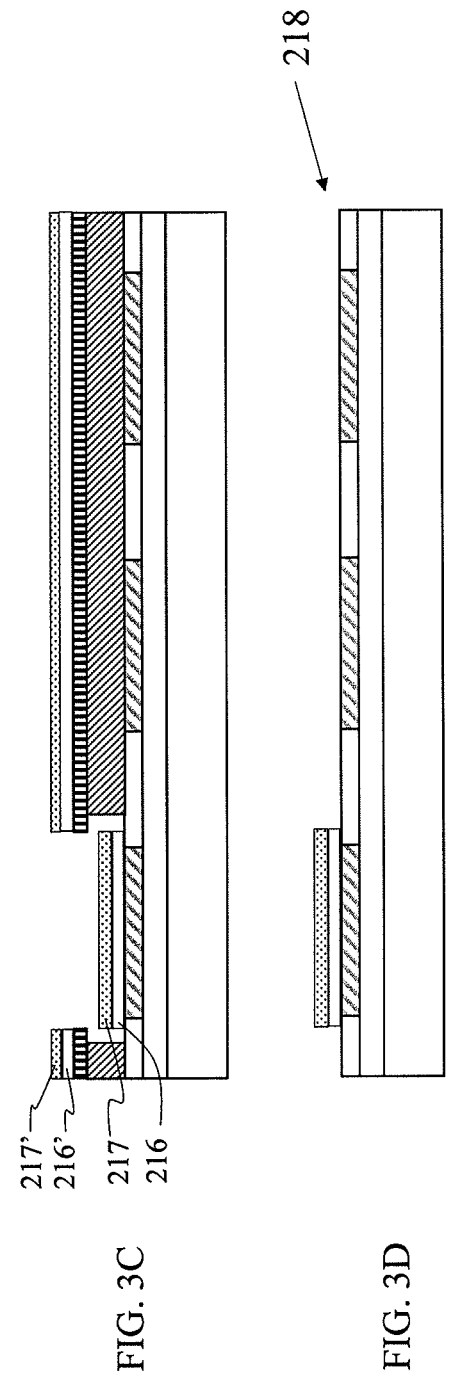

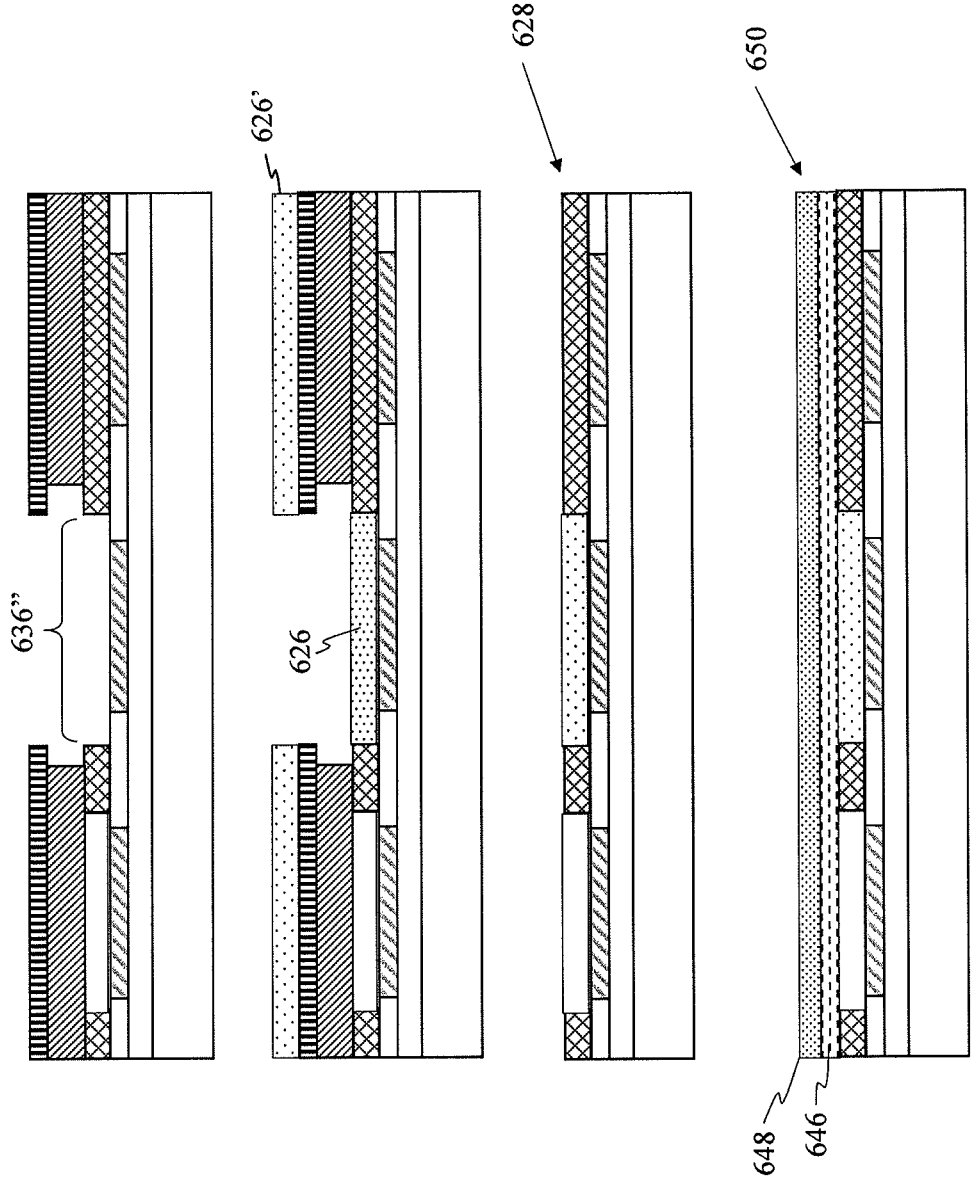

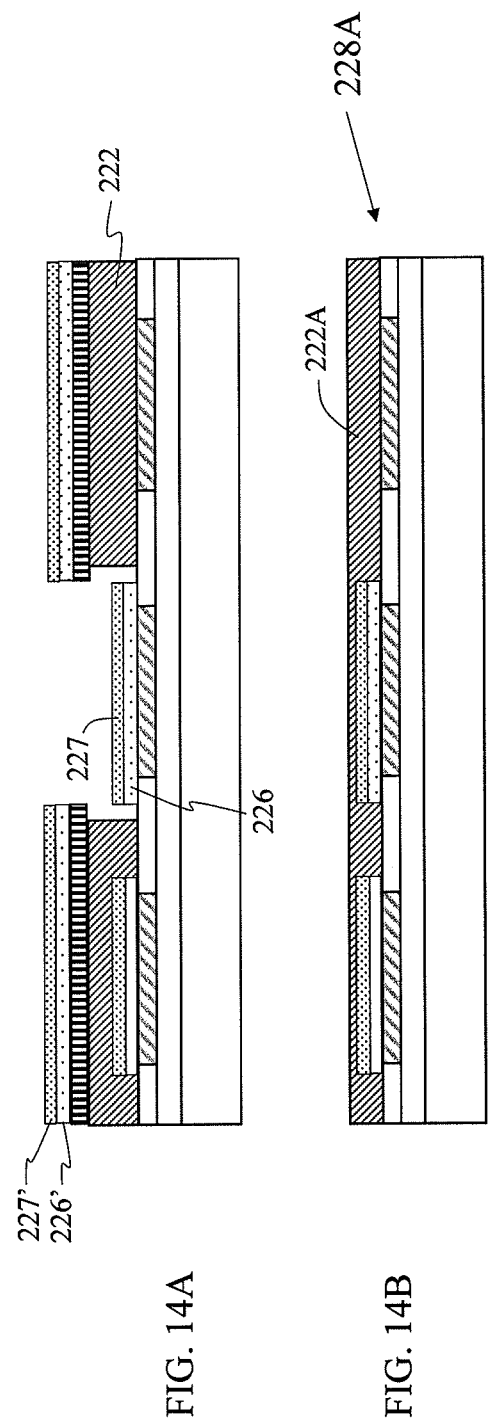

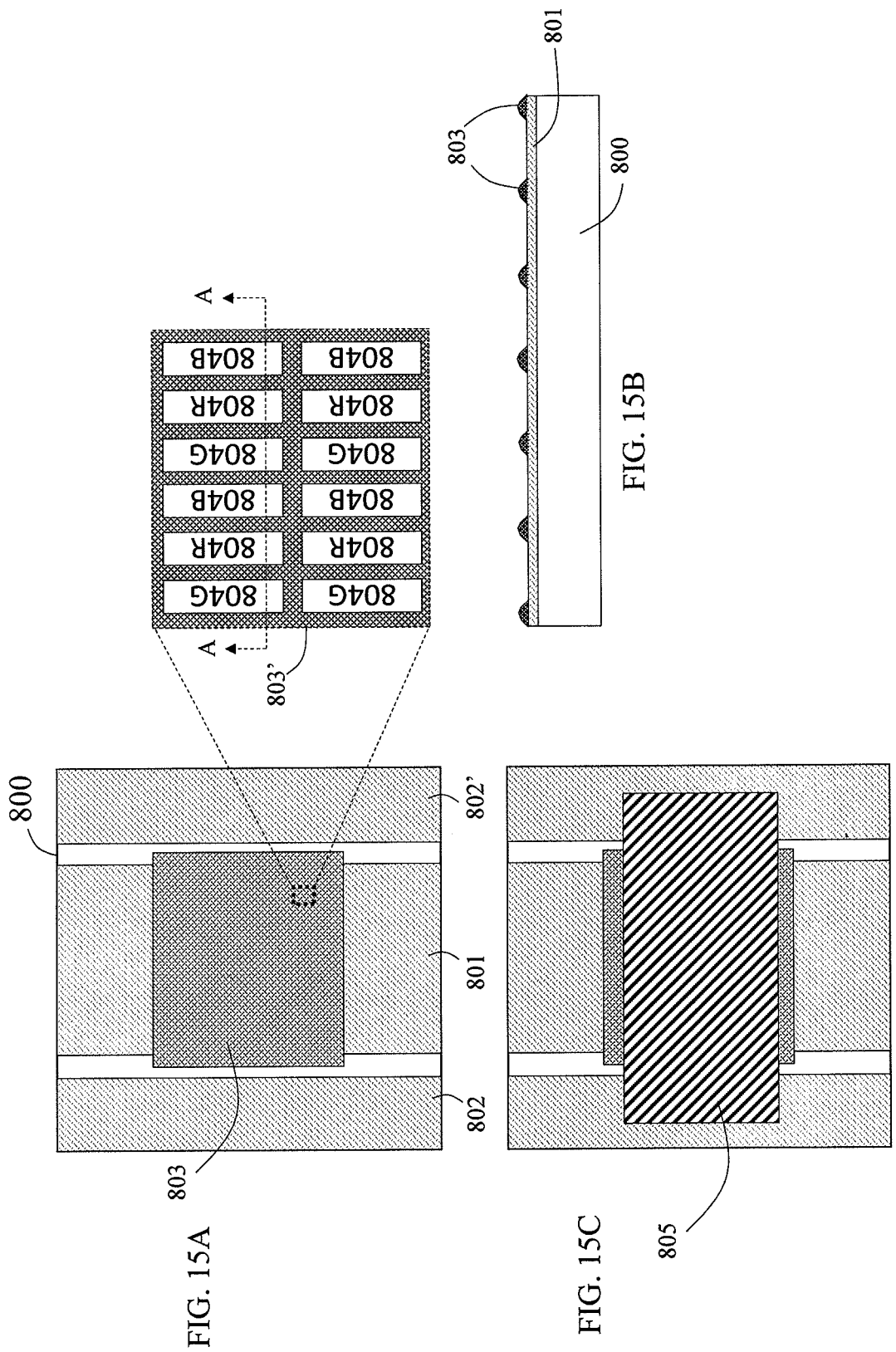

PHOTOLITHOGRAPHIC PATTERNING OF ORGANIC ELECTRONIC DEVICES

CROSS-REFERENCE TO RELATED APPLICATIONS

This application is a Continuation of U.S. patent application Ser. No. 15/867,019, filed on Jan. 10, 2018, which is a Continuation of U.S. patent application Ser. No. 15/501,092, filed on Feb. 1, 2017, now U.S. Pat. No. 9,899,636, which is a National Stage Application of PCT/US2015/043168 filed on Jul. 31, 2015, which claims the benefit of U.S. Provisional Application No. 62/031,888, filed on Aug. 1, 2014, and which applications are incorporated herein by reference. A claim of priority is made to each of the above disclosed applications. This application is also related to PCT International Applications PCT/US2015/043175, PCT/US2015/043034, filed on Jul. 31, 2015 and claiming the benefit of U.S. Provisional Applications Nos. 62/031,891 (filed on Aug. 1, 2014), 62/031,897 (filed on Aug. 1, 2014) and 62/096,582 (filed on Dec. 24, 2014), and 62/031,903 (filed on Aug. 1, 2014), respectively.

BACKGROUND

1. Field of the Disclosure

The present disclosure relates to photolithographic patterning of organic, electronic and organic electronic devices. The disclosed methods and materials are particularly useful for patterning OLED devices.

2. Discussion of Related Art

Organic electronic devices may offer significant performance and price advantages relative to conventional inorganic-based devices. As such, there has been much commercial interest in the use of organic materials in electronic device fabrication. For example, displays based on organic light-emitting diode (OLED) technology have recently gained popularity and offer numerous advantages over many other display technologies. Although solution-deposited OLED materials have been developed, the highest-performing OLED devices typically use vapor-deposited thin films of active organic materials.

A key challenge for full-color OLED displays is patterning the array of red, green and blue pixels. For vapor-deposited OLEDs, a fine metal mask having openings corresponding to the fineness of the desired pattern is conventionally used. However, a vapor deposited film builds up on the mask which may eventually narrow the mask openings or cause deforming stresses on the mask. Therefore, it is necessary to clean the mask after a certain number of uses, which is disadvantageous from the viewpoint of manufacturing costs. In addition, when a fine metal mask is increased in size to accommodate larger substrates, the positional accuracy of the mask openings becomes much more difficult, both from the standpoint of initial alignment and then maintaining the alignment during deposition due to thermal expansion issues. Positional accuracy may be improved to a degree by enhancing the stiffness of a frame of the mask, but this increase the weight of the mask itself causes other handling difficulties.

Thus, a need exists for cost-effective patterning of organic electronic devices such as OLED devices, and particularly those having emissive pattern dimensions of less than about 100 µm.

SUMMARY

The authors have demonstrated OLED devices having photolithographically patterned red, green and blue emissive areas separated by 4 µm and having an aperture ratio of greater than 60%.

In accordance with the present disclosure, a method of making an OLED device includes:
providing a device substrate having a first array of bottom electrodes and a second array of bottom electrodes; providing a first undercut lift-off structure over the device substrate having a first pattern of openings corresponding to the first array of bottom electrodes; depositing one or more first organic EL medium layers including at least a first light-emitting layer over the first undercut lift-off structure and over the first array of bottom electrodes; removing the first undercut lift-off structure and overlying first organic EL medium layer(s) by treatment with a first lift-off agent comprising a fluorinated solvent to form a first intermediate structure; providing a second undercut lift-off structure over the first intermediate structure having a second pattern of openings corresponding to the second array of bottom electrodes; depositing one or more second organic EL medium layers including at least a second light-emitting layer over the second undercut lift-off structure and over the second array of bottom electrodes; removing the second undercut lift-off structure and overlying second organic EL medium layer(s) by treatment with a second lift-off agent comprising a fluorinated solvent to form a second intermediate structure; and providing a common top electrode in electrical contact with the first and second organic EL medium layers.

In another aspect of the present disclosure, a full color OLED display includes: a substrate having a display region, the display region including an array of first, second and third organic EL elements, each array having individually patterned light-emitting layers for emission of differently colored light, wherein each of the first organic EL elements is spaced 4 µm or less from a second or third organic EL element and a combined emissive area of all of the first, second and third organic EL elements is at least 60% of a total area occupied by the display region.

BRIEF DESCRIPTION OF DRAWINGS

FIG. 14 is a series (14A-14B) of cross-sectional views depicting various stages in the formation of an active matrix OLED device according to an embodiment of the present disclosure; and FIG. 15 is a series (15A-15C) of views depicting various stages and views in the formation of a test device according to an embodiment of the present disclosure.

DETAILED DESCRIPTION

Figure 1:
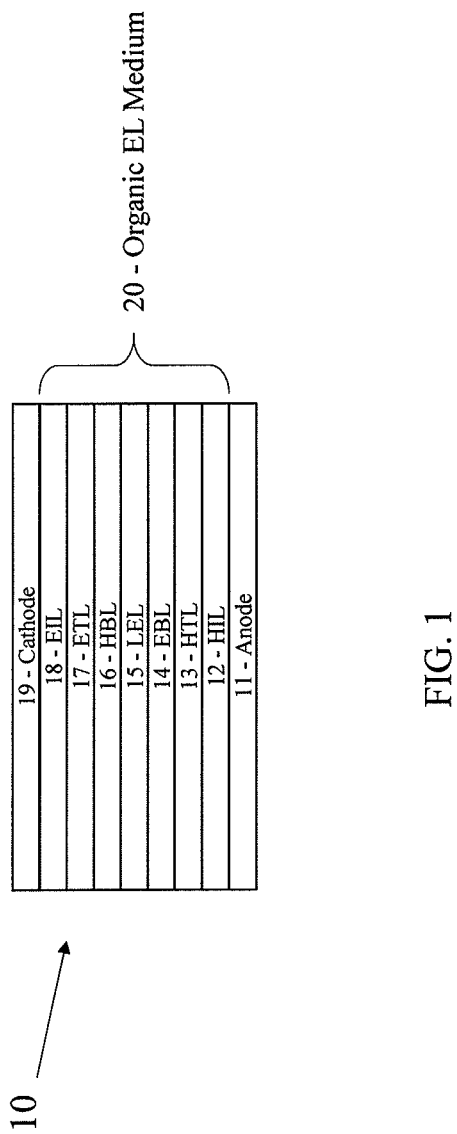
FIG. 1 is cross sectional view of a representative OLED device.

It is to be understood that the attached drawings are for purposes of illustrating the concepts of the disclosure and may not be to scale.

A feature of the present disclosure is the use of "orthogonal" photoresist structures and processing agents that are compatible with sensitive organic electronic devices and materials such as OLED devices and materials, i.e., they are chosen to have low interaction with sensitive device layers that are not intended to be dissolved or otherwise damaged. Conventional photoresist materials typically use harsh organic solvents and often strongly caustic developers that can easily damage one or more layers of an OLED device. Particularly useful orthogonal photoresist structures and processing agents include fluorinated polymers or molecular solids and fluorinated solvents. Some orthogonal photoresist structures and systems are disclosed in U.S. patent application Ser. Nos. 12/864,407, 12/994,353, 14/113,408, and 14/291,692, the contents of which are incorporated by reference. The photoresist structures of the present disclosure may optionally have an undercut profile, which can be advantageous in so-called "lift-off" photolithographic patterning. Photoresist structures intended for lift-off patterning may also be referred to herein as lift-off structures. Undercut lift-off structures are preferred wherein a top portion is wider than a base portion adjacent to a substrate. The photoresist structure may be a single layer (e.g. an inverted trapezoid), a bilayer or multilayer structure. It is preferred that at least the layer or portion of the photoresist structure in contact with the sensitive organic electronic device is a fluorinated polymer or molecular solid provided, e.g., from a fluorinated coating solvent or by vapor deposition. Orthogonality can be tested by, for example, immersion of a device comprising the material layer of interest into a target composition prior to operation (e.g., into a coating solvent, a developing agent, a lift-off agent, or the like). The composition is orthogonal if there is no serious reduction in the functioning of the device.

Certain embodiments disclosed in the present disclosure are particularly suited to the patterning of solvent-sensitive, active organic materials. Examples of active organic materials include, but are not limited to, organic electronic materials, such as organic semiconductors, organic conductors, OLED (organic light-emitting diode) materials and organic photovoltaic materials, organic optical materials and biological materials (including bioelectronics materials). Many of these materials are easily damaged when contacted with organic or aqueous solutions used in conventional photolithographic processes. Active organic materials are often coated to form a layer that may be patterned. For some active organic materials, such coating can be done from a solution using conventional methods. Alternatively, some active organic materials are coated by vapor deposition, for example, by sublimation from a heated organic material source at reduced pressure. Solvent-sensitive, active organic materials can also include composites of organics and inorganics. For example, the composite may include inorganic semiconductor nanoparticles (quantum dots). Such nanoparticles may have organic ligands or be dispersed in an organic matrix. The present disclosure is particularly directed towards patterning of OLED devices, but the concepts and methods disclosed herein can be applied to other organic electronic or bioelectronic devices.

OLED Structures

Many different types of OLED device structures have been developed over the years. Essentially, an OLED device includes at a minimum an anode for injecting holes, a cathode for injecting electrons and an organic EL medium sandwiched between the electrodes wherein the holes and electrons combine to produce light emission. OLED devices are often provided on a substrate. The electrode adjacent to a substrate is typically referred to as the first or bottom electrode. The electrode spaced away from the substrate by the organic EL medium is typically referred to as the second or top electrode. A common structure ("standard structure") includes an anode as the bottom electrode provided on a substrate with subsequent organic layers deposited over the anode and finally a cathode deposited over the organic layers to form the top electrode. An "inverted structure" is just the reverse and has a cathode as the bottom electrode provided on a substrate with subsequent organic layers deposited over the cathode and finally an anode deposited over the organic layers to form a top electrode. A "bottom-emitting" OLED typically includes a transparent or translucent bottom electrode and a reflective or light absorbing top electrode structure. That is, light is directed through the device substrate. A "top-emitting" OLED includes a transparent or translucent top electrode and a reflective or light absorbing bottom electrode structure. That is, light is directed away from the device substrate. A "transparent" OLED has transparent or translucent top and bottom electrodes.

A non-limiting example of an OLED device 10 is shown in FIG. 1 and includes anode 11, hole-injecting layer (HIL) 12, hole-transporting layer (HTL) 13, electron-blocking layer (EBL) 14, light-emitting layer (LEL) 15 (sometimes referred to in the art as an emissive layer or EML), hole-blocking layer (HBL) 16, electron-transporting layer (ETL) 17, electron-injecting layer (EIL) 18 and cathode 19. The layers between the anode and cathode are often collectively referred to as the organic EL medium 20. There are many other OLED layer architectures known in the art having fewer or additional layers and there can be overlap in layer functionality. For example, if an EBL is used, it typically also has hole-transporting properties in addition to electron-blocking properties. An HBL, if used, typically has electron-transporting properties. The LEL might have predominantly hole-transporting or electron-transporting properties, or it might have both. There can be multiple light emitting layers. So-called "tandem" architecture is known that includes one or more charge separation layers between light-emitting stacks that can double current efficiency.

Some non-limiting examples of materials useful for OLED devices are discussed below. Although the emphasis is on organic EL medium materials that can be vapor deposited, certain embodiments of the present disclosure may instead use solution deposited OLED materials. A few non-limiting examples of OLED material and structures can be found in U.S. Pat. Nos. 8,106,582 and 7,955,719, the entire contents of which are incorporated by reference.

When EL emission is viewed through the anode, the anode should be substantially transparent to the emission of interest. The term "transparent" herein means that at least 30% of emitted light is transmitted, preferably at least 50%. Common transparent anode materials used in the present disclosure are indium-tin oxide (ITO), indium-zinc oxide (IZO), and tin oxide, but other metal oxides can work including, but not limited to, aluminum- or indium-doped zinc oxide, magnesium-indium oxide, and nickel-tungsten oxide. In addition to these oxides, metal nitrides such as gallium nitride, and metal selenides such as zinc selenide, and metal sulfides such as zinc sulfide, can be used as the anode. For applications where EL emission is viewed only through the cathode electrode, the transmissive characteristics of the anode are immaterial and many conductive materials can be used, regardless if transparent, opaque, or reflective. Example conductors for the present disclosure include, but are not limited to, gold, iridium, molybdenum, palladium, and platinum. Unless unique HIL materials are used, typical anode materials have a work function of at least 4.0 eV.

If EL emission is viewed through the cathode, it must be transparent or nearly transparent. For such applications, metals must be thin (preferably less than 25 nm) or one may use transparent conductive oxides (e.g. indium-tin oxide, indium-zinc oxide), or a combination of these materials. Some non-limiting examples of optically transparent cathodes have been described in more detail in U.S. Pat. No. 5,776,623. If EL emission is not viewed through the cathode, any conductive material known to be useful in OLED devices may be selected, including metals such as aluminum, molybdenum, gold, iridium, silver, magnesium, the above transparent conductive oxides, or combinations of these. Desirable materials promote electron injection at low voltage and have effective stability. Useful cathode materials often contain a low work function metal (<4.0 eV) or metal alloy. Cathode materials can be deposited, for example, by evaporation, sputtering, or chemical vapor deposition.

The HIL can be formed of a single material or a mixture of materials. The hole-injecting layer may be divided into several layers having different composition. The hole-injecting material can serve to improve the film formation property of subsequent layers and to facilitate injection of holes into the hole-transporting layer. Suitable materials for use in the hole-injecting layer include, but are not limited to porphyrin and phthalocyanine compounds as described in U.S. Pat. No. 4,720,432, thiophene-containing compounds, phosphazine compounds, and certain aromatic amine compounds. The HIL may include an inorganic compound such as a metal oxide (e.g., molybdenum oxide), metal nitride, metal carbide, a complex of a metal ion and organic ligands, and a complex of a transition metal ion and organic ligands. Suitable materials for use in the hole-injecting layer may include plasma-deposited fluorocarbon polymers (CFx) as described in U.S. Pat. No. 6,208,075, certain hexaazatriphenylene derivatives as described in U.S. Pat. No. 6,720,573 B2 (e.g. hexacyanohexaazatriphenylene) or tetracyanoquinone derivatives such as F4TCNQ. The hole-injecting layer can also be composed of two components: for example, an aromatic amine compound, doped with a strong oxidizing agent, such as dipyrazino[2,3-f:2',3'-h]quinoxalinehexacarbonitrile, F4TCNQ, or FeCl3.

The HTL can be formed of a single or a mixture of organic or inorganic materials and may be divided into several layers. The hole-transporting layer most commonly includes a tertiary aryl amine, e.g., a benzidine or a carbazole, but instead (or in addition) may comprise a thiophene, or other electron-rich material. EBL materials (if used) are generally selected from the same group as HTL materials and have an electron conduction band significantly higher in energy (more difficult to reduce) than the overlying LEL thereby creating a barrier to further electron transport.

The LEL commonly includes a host material and a light-emitting dopant. Injected holes and electrons recombine in the LEL. Hosts include HTL materials, ETL materials, a mixture of HTL and ETL materials or ambipolar materials readily capable of transporting holes and electrons. Examples of common hosts for singlet emission include polycyclic aromatic compounds such as anthracene derivatives. Examples of common hosts for triplet emission include carbazole compounds and aromatic amines. A wide variety of light-emitting dopants are known and are used to provide the desired emission wavelength by harvesting excitons created from the electron/hole charge injection. Many common singlet emitting dopants are aromatic organic compounds whereas many common triplet emitting dopants are metal complexes of iridium or platinum.

The ETL can be formed of a single or a mixture of organic or inorganic materials and may be divided into several layers. Common ETL materials include metal oxine chelates such as Alq, phenanthroline derivatives such as BCP, triazines, benzimidazoles, triazoles, oxadiazoles, silane compounds such as silacyclopentadiene derivatives, and borane derivatives. HBL materials (if used) are generally selected from the same group as ETL materials and have hole conduction band significantly lower in energy (more difficult to oxidize) than the underlying LEL thereby creating a barrier to further hole transport.

The EIL may include an ETL material plus a reducing dopant at or near the interface between the cathode and ETL. The reducing dopant can be organic, inorganic, or metal complexes. Common reducing dopants include alkali metals such as Cs or combinations of alkali metals. The EIL may include an alkali or alkaline metal complex, salt or oxide (e.g., lithium quinolate, LiF, CaO) that forms a reducing dopant upon deposition of a cathode material such as aluminum.

OLED Deposition

There are many ways to deposit organic EL medium materials onto a substrate including, but not limited to, solution coating, vapor deposition, and transfer from a donor sheet. In certain embodiments of the present disclosure at least some of the organic OLED layers be deposited by vapor deposition means, e.g., physical vapor deposition in a reduced pressure environment. In some embodiments, most or all of the organic EL medium layers are provided by vapor deposition.

Many types of vapor deposition equipment are suitable. Such equipment may use point sources, linear sources, vapor-injection sources, carrier gas-assisted sources (OVPD) and the like. In some embodiments, the vapor plume is preferably highly directional to achieve a controlled line-of-site deposition through a patterned photoresist structure as will be shown later.

OLED Devices/Backplanes

There is no particular limitation on the type of OLED device that may be fabricated based on methods of the present disclosure, so long as some patterning is intended. The present methods are especially directed to full color OLED displays such as active matrix OLED (AMOLED) and passive matrix OLED (PMOLED), but the methods may be used to prepare OLED lighting and signage. OLED device substrates may be rigid or flexible. Support materials include, but are not limited to, glass, polymers, ceramics and metals, and composites or laminates thereof.

AMOLED backplanes typically include an array of independently addressable first (bottom) electrodes that are connected to thin film transistor (TFT) circuitry provided over a substrate typically in a multilayer structure. The TFT may be based on Si, metal oxide or organic semiconductors (OTFT). In addition to the semiconductors, dielectrics and conductors are used to prepare structures that form the transistors, capacitors, wiring . . . etc. as is known in the art.

OLED Patterning

Figure 2:
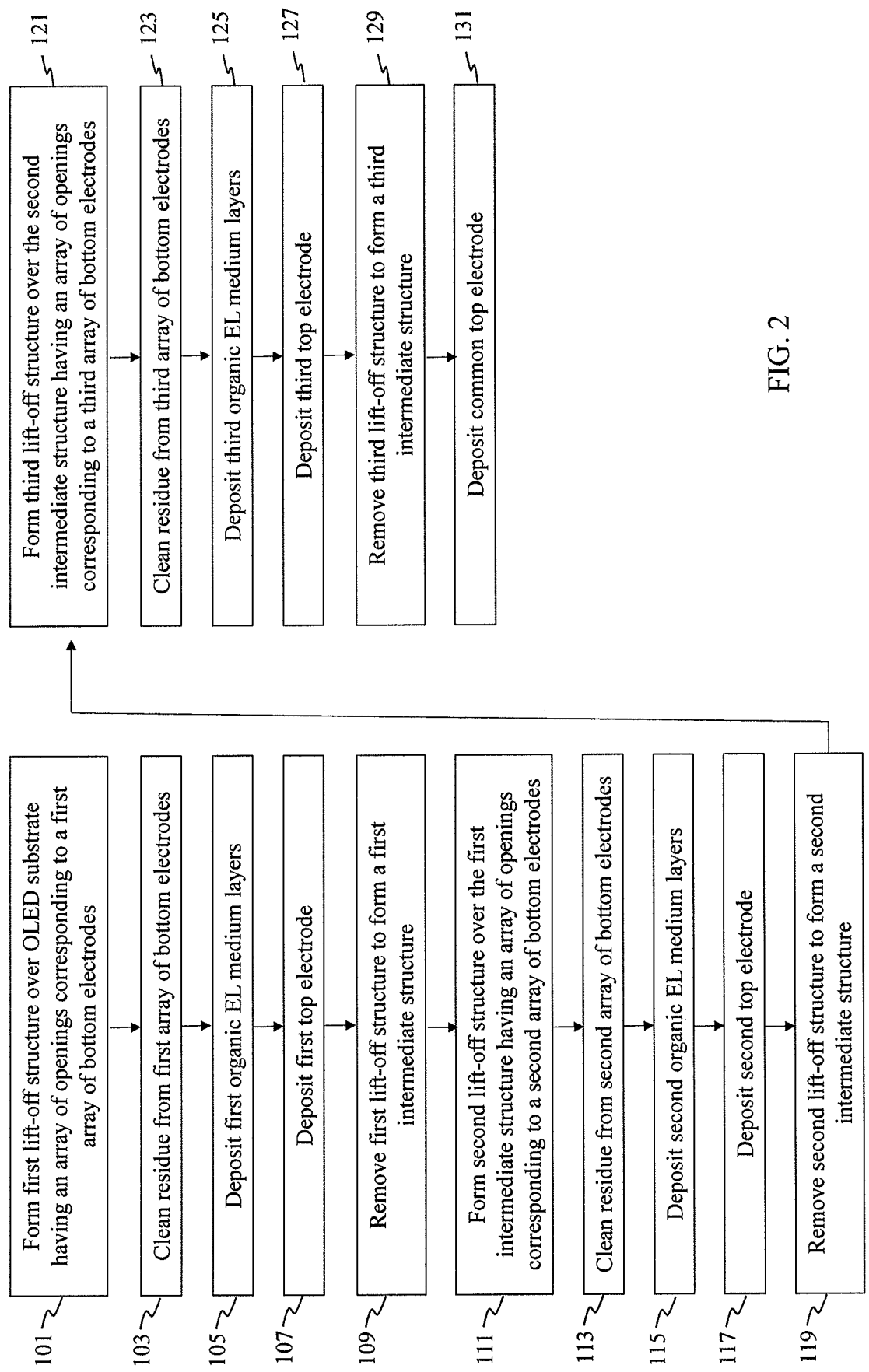
FIG. 2 is a flow chart depicting the steps in an embodiment of the present disclosure.

FIG. 2 is a flow diagram showing steps for forming a three-color (e.g. RGB) active matrix OLED device according to an embodiment of the present disclosure. FIGS. 3A through 3K show portions of these steps in cross sectional form. In step 101, a first lift-off structure (e.g. an undercut lift-off structure) is formed over an OLED substrate. The lift-off structure has an array of openings corresponding to a first array of bottom electrodes. The bottom electrodes may serve as anodes as part of a "standard structure" OLED or serve as cathodes as part of an "inverted structure" OLED. In a preferred embodiment, the bottom electrodes are already formed as part of the OLED substrate, but optionally, the bottom electrodes may be formed or further modified by depositing one or more desired anode or cathode materials through the array of openings of the lift-off structure (not shown in FIG. 2).

FIG. 3A shows an embodiment of an OLED substrate 200 or backplane having a support 201 (e.g., flexible or non-flexible glass, plastic or ceramic), a TFT layer portion 202 (which may include multiple layers of wiring, dielectric and semiconductor materials), a first bottom electrode 210, a second bottom electrode 220, a third bottom electrode 230 and an electrode-separating dielectric 203. The first, second and third bottom electrodes each represent one bottom electrode in a first, second and third array of bottom electrodes, respectively, all independently addressable. That is, the first array of bottom electrodes forms a portion of a first array of independently addressable first OLED devices, the second array of bottom electrodes forms a portion of a second array of independently addressable second OLED devices and so on as needed. Although not shown, the electrode-separating dielectric often extends above and slightly over the edges of the bottom electrodes and may serve to help define the functional emissive area of the corresponding OLED device. Also not shown, the substrate may further include common organic EL medium layers that will make up a portion of each organic EL element. For example, the substrate may include a common HIL and HTL.

FIG. 3B shows a first lift-off structure 211 having an opening 215 corresponding to the first bottom electrode. In the embodiment shown here, the first lift-off structure 211 is a bilayer of first material layer 212 and first patterned photoresist layer 213. An undercut region 214 is formed in layer 212. The first lift-off structure 211 may instead be a single layer or have more than two layers. Lift-off structures are discussed in more detail later.

Referring again to FIG. 2, optional (but preferred) step 103 includes cleaning residue from the first array of bottom electrodes (or from any optional common organic EL medium layers). This can be done using appropriate solvents, or preferably, using "dry etching" methods. Herein, the term "dry etchant" is used broadly and refers to any useful gaseous material possessing energy sufficient to clean a target area. Dry etching includes, but is not limited to, glow discharge methods (e.g., sputter etching and reactive ion etching), ion beam etching (e.g., ion milling, reactive ion beam etching, ion beam assisted chemical etching) and other "beam" methods (e.g., ECR etching and downstream etching), all of which are methods known in the art. Some common dry etchants include oxygen plasma, argon plasma, UV/ozone, $CF_4$ and $SF_6$, and various combinations. Alternatively a substantially non-oxidizing plasma may be used, e.g., one including hydrogen and a non-oxidizing gas such as nitrogen or helium.

Referring to FIG. 2 and FIG. 3C, the first organic EL medium layer(s) are deposited in step 105 followed by deposition of the first top electrode in step 107 over the first organic EL medium layers. A portion of the first organic EL medium layers 216' is deposited over the lift-off structure whereas another portion of the first organic EL medium layers 216 goes through the opening 215 and is deposited on the first array of bottom electrodes. With respect to the top electrode, a portion of the first top electrode 217' is deposited over the lift-off structure and onto organic EL medium layers 216' whereas another portion of the first top electrode 217 goes through opening 215 and is deposited onto first organic EL medium layers 216. Not shown, but if the substrate included any optional common organic EL medium layers as discussed above, the first organic EL medium layers 216 would include those necessary to finish the OLED stack over the first array of bottom electrodes.

In step 109 the lift-off structure is removed along with the overlying first organic EL medium layers 216' and first top electrode 217'. In an embodiment, this is done by providing a solvent that dissolves the first material layer 212 but that is orthogonal to the patterned photoresist, organic EL medium materials and cathode. This detaches the first patterned photoresist 213 and overlying layers 216' and 217', thereby forming a first intermediate structure 218 as shown in FIG. 3D having a first array of OLED devices, e.g., red-emitting OLEDs, each having a bottom electrode 210, organic EL medium layers 216 and top electrode 217. Alternatively, rather than dissolving the first material layer, the lift-off solvent may swell the lift-off structure thereby causing its delamination or otherwise affect the adhesion between the substrate and the lift-off structure.

Steps 101 through 109 are basically repeated two more times in steps 111 through 119 and steps 121 through 129, but with different sets of organic EL medium layers (226 and 236, FIGS. 3F and 3I) to form second and third arrays of OLED devices, e.g., green and blue.

Figure 3E:
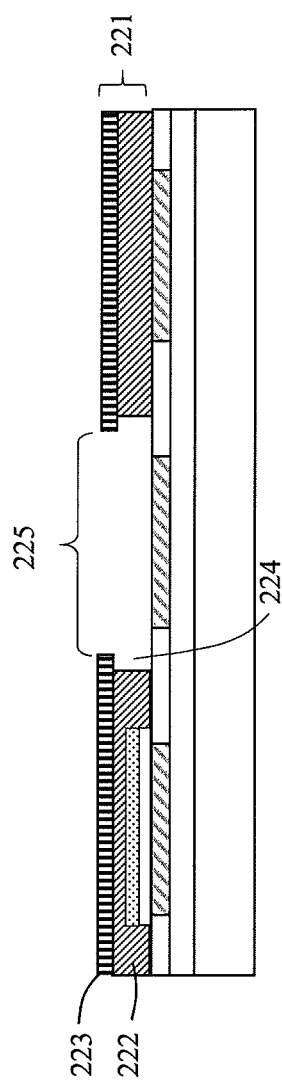
FIG. 3 is a series (3A-3K) of cross-sectional views depicting various stages in the formation of an active matrix OLED device according to an embodiment of the present disclosure.

In step 111 of FIG. 2, a second lift-off structure is formed over the first intermediate structure. The second lift-off structure has an array of openings corresponding to a second array of bottom electrodes. FIG. 3E shows a second lift-off structure 221 having an opening 225 corresponding to the second bottom electrode. In the embodiment shown here, the second lift-off structure 221 is again a bilayer of second material layer 222 and second patterned photoresist layer 223. An undercut region 224 is formed in layer 222. The second lift-off structure 221 may instead be a single layer or have more than two layers. The materials and methods used to form second lift-off structure 221 may be the same as or different from those used to form the first lift-off structure 211.

Step 113 in FIG. 2 indicates an optional (but preferred) step of cleaning residue from the second array of bottom electrodes using one of the methods previously described with respect to step 103. The residue cleaning method may the same as or different from step 103.

Figure 3F:
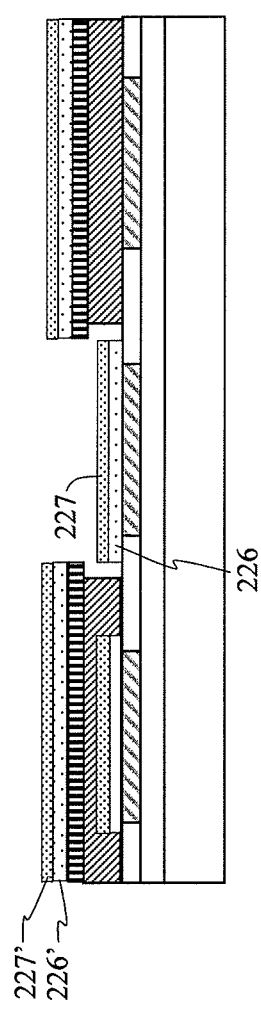

Referring to FIG. 2 and FIG. 3F, the second organic EL medium layers are deposited in step 115 followed by deposition of the first top electrode in step 117 over the second organic EL medium layers. Although not limiting, in a preferred embodiment, the second organic EL medium layers are different from the first organic EL medium layers, e.g., to provide a different emission color. The second top electrode may be the same as the first top electrode, but it may also be different, e.g., in order to achieve some desired charge injection or property. A portion of the second organic EL medium layers 226' is deposited over the lift-off structure whereas another portion of the second organic EL medium layers 226 goes through the opening 225 and is deposited on the second array of bottom electrodes. With respect to the top electrode, a portion of the second top electrode 227' is deposited over the lift-off structure and onto second organic EL medium layers 226' whereas another portion of the second top electrode 227 goes through opening 225 and is deposited onto second organic EL medium layers 226.

Figure 3G:
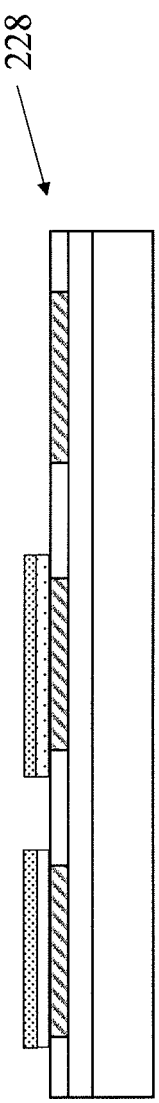

In step 119 the lift-off structure is removed along with the overlying second organic EL medium layers 226' and second top electrode 227', e.g., by providing a solvent that dissolves the second material layer 222, in a manner analogous to that previously described for step 109. Removal of the second lift off structure forms a second intermediate structure 228 as shown in FIG. 3G having a first array of OLED devices, e.g., red-emitting OLEDs, and a second array of OLED devices, e.g., green-emitting OLEDs, each having a bottom electrode 220, organic EL medium layers 226 and top electrode 227.

Figure 3H:
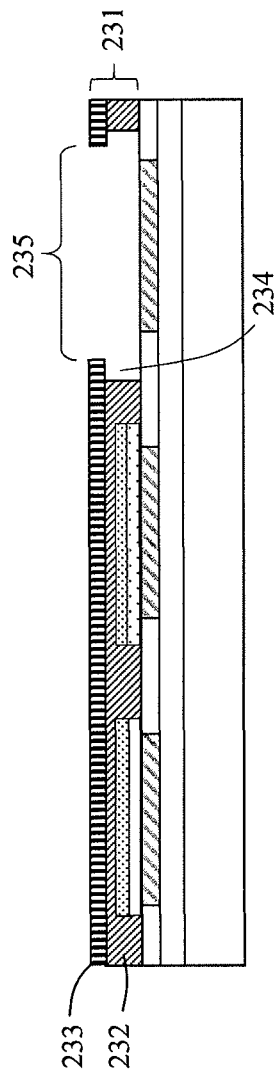

In step 121 of FIG. 2, a third lift-off structure is formed over the second intermediate structure. The third lift-off structure has an array of openings corresponding to a third array of bottom electrodes. FIG. 3H shows a third lift-off structure 231 having an opening 235 corresponding to the third bottom electrode. In the embodiment shown here, the first lift-off structure 231 is again a bilayer of third material layer 232 and third patterned photoresist layer 233. An undercut region 234 is formed in layer 232. The third lift-off structure 231 may instead be a single layer or have more than two layers. The materials and methods used to form third lift-off structure 231 may be the same as, or different from, those used to form the first or second lift-off structures.

Step 123 in FIG. 2 indicates an optional (but preferred) step of cleaning residue from the third array of bottom electrodes using one of the methods previously described with respect to step 103. The residue cleaning method may the same as or different from step 103.

Figure 3I:
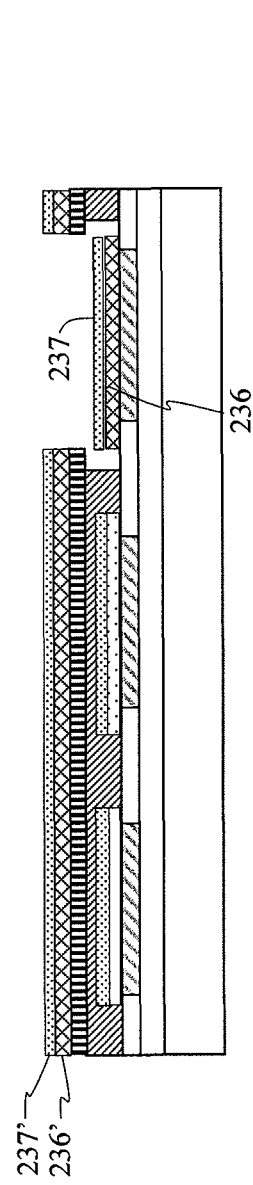

Referring to FIG. 2 and FIG. 3I, the third organic EL medium layers are deposited in step 125 followed by deposition of the third top electrode in step 127 over the third organic EL medium layers. Although not limiting, in a preferred embodiment, the third organic EL medium layers are different from the first and second organic EL medium layers, e.g., to provide a different emission color. The third top electrode may be the same as the first or second top electrode, but it may also be different, e.g., in order to achieve some desired charge injection or property. A portion of the third organic EL medium layers 236' is deposited over the lift-off structure whereas another portion of the third organic EL medium layers 236 goes through the opening 235 and is deposited on the third array of bottom electrodes. With respect to the top electrode, a portion of the third top electrode 237' is deposited over the lift-off structure and onto third organic EL medium layers 236' whereas another portion of the third top electrode 237 goes through opening 235 and is deposited onto third organic EL medium layers 236.

Figure 3J:
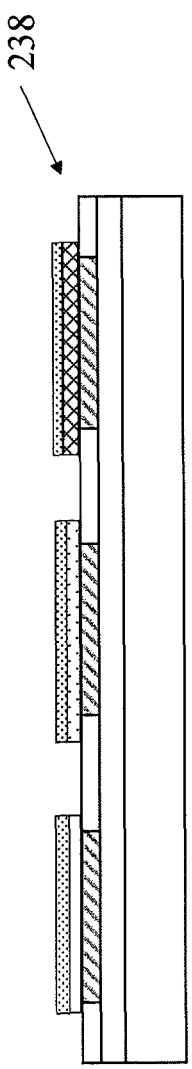

In step 129 the third lift-off structure is removed along with the overlying third organic EL medium layers 236' and third top electrode 237', e.g., by providing a solvent that dissolves the third material layer 232, in a manner analogous to that previously described for step 109. Removal of the third lift off structure forms a third intermediate structure 238 as shown in FIG. 3J having a first array of OLED devices, e.g., red-emitting OLEDs, and a second array of OLED devices, e.g., green-emitting OLEDs, and a third array of OLED devices, e.g., blue-emitting, each having a bottom electrode 230, organic EL medium layers 236 and top electrode 237.

Figure 3K:
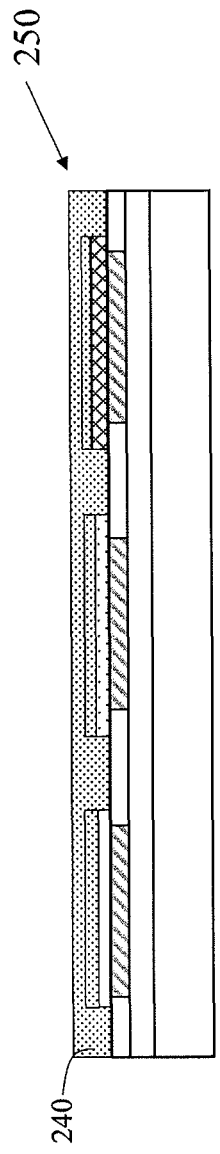

Referring to FIG. 2 and FIG. 3K, step 131 includes depositing a common top electrode 240 over the first, second and third arrays of OLED devices thereby electrically connecting the first, second and third top electrodes and forming active matrix OLED device 250. Relative to the first, second and third top electrodes, the material used for the common top electrode may be the same or different. Prior to depositing the common top electrode, the top electrodes may be treated to improve electrical contact with the common top electrode. This can help overcome contact resistance introduced by metal oxide or thin polymer residue that may be present on the top electrodes. For example, the top electrodes may be treated with a low work function metal, e.g., an alkali metal, an alkaline metal or an alkaline earth metal. Alternatively, treatment may include a reducing gas environment, e.g. a gas environment including hydrogen. Alternatively, treatment may include a substantially non-oxidizing plasma, e.g. one including hydrogen and another non-oxidizing gas such as nitrogen or helium. Alternatively, treatment may include contact with a cleaning agent having a chemical composition different from the lift-off agent, the cleaning agent including a fluorinated solvent. For example, the cleaning agent may include a fluorinated solvent and a protic solvent such as an alcohol (e.g. IPA) at 15% or less by volume, alternatively 5% or less by volume. Alternatively, the protic solvent may include an organic acid at 5% or less by weight or alternatively 1% or less by weight. Alternatively, the cleaning agent may include a mixture of two fluorinated solvents, e.g., a mixture of a fluorinated solvent used in the lift-off agent and a second fluorinated solvent that is more polar or has less fluorine content by weight or both.

Lift-Off Structures

The lift-off structure allows separation of "unwanted" overlying active materials (e.g., OLED materials) in the lift-off patterning process. In an embodiment, at least a portion of the lift-off structure is soluble in a solvent that is orthogonal to the array of OLED devices and the dissolution of this portion enables the separation. In an embodiment, the lift-off structure has a substantially vertical sidewall profile (e.g., 90°±10° relative to the substrate), or preferably, an undercut sidewall profile. The undercut reduces the amount of OLED material that deposits on the sidewalls so that the sidewalls remain unblocked to an appropriate lift-off agent. The thickness of the lift-off structure depends on the particular type of device and intended dimensions, but in general, it is in a range of 0.1 to 10 µm, alternatively in a range of 0.2 to 5 µm, or alternatively in a range of 0.5 to 3 µm.

An important requirement of the lift-off structure is that it not harm underlying device layers, neither in the lift-off structure's formation nor its subsequent processing. In an embodiment, the lift-off structure includes a layer of a fluorinated material in contact with one or more underlying OLED device layers. In one embodiment, the fluorinated material is photosensitive and can form the lift-off structure by exposure to radiation and development. Such a material may be a positive working (portions exposed to radiation are removed during development) or negative working (portions not exposed to radiation are removed during development). Non-limiting examples of photosensitive fluorinated materials and systems include those disclosed in U.S. patent application Ser. Nos. 12/994,353, 14/260,705, 14/291,692, 14/291,767, and 14/539,574 the contents of which are incorporated by reference. In an embodiment, the photosensitive fluorinated material is a negative working photopolymer provided from a fluorinated solvent, e.g., a hydrofluoroether. In an embodiment, the photosensitive fluorinated photopolymer is developed in a developing agent comprising one or more fluorinated solvents, e.g., a hydrofluoroether. In an embodiment, a lift-off agent for use with a photosensitive fluorinated photopolymer includes a fluorinated solvent, e.g., a hydrofluoroether. The action of the lift-off agent is to dissolve the photopatterned fluoropolymer or alternatively cause delamination of the photopatterned polymer to the substrate, e.g., by swelling or inducing adhesion failure.

It can be challenging to achieve necessary photosensitivity, sidewall profile and orthogonality in a single layer lift-off structure. In another embodiment, the lift-off structure includes multiple layers, e.g., as shown in FIG. 3 and as described in U.S. patent application Ser. No. 12/864,407, the contents of which are incorporated by reference. In an embodiment, a material layer comprising a fluorinated material such as a fluorinated molecular solid or fluorinated polymer is provided over a device substrate that may include an active organic material. The fluorinated material may be vapor deposited (e.g., if a molecular solid) or coated from a highly fluorinated solvent including, but not limited to, a hydrofluoroether or a perfluorinated solvent. This layer forms the base of the multi-layer lift-off structure and is designed to be chemically inert relative to the underlying device substrate. It does not require photo-active elements such as photoacid generators or reactive groups that may, in some cases, harm the underlying device. The base layer may optionally comprise a light absorbing material to protect the underlying device from potentially high-intensity radiation of the overlying photoresist layer (see below). If so, the light absorbing material is preferably incorporated into base the layer covalently, e.g., by attaching a light absorbing dye to a fluorinated polymer. The base layer is further designed to be readily soluble in a fluorinated or other orthogonal solvent to enable rapid lift-off as described earlier. Alternatively, the lift-off agent may cause delamination of the base layer from the substrate, e.g., by swelling or inducing adhesion failure.

Over the base layer, e.g., over a fluorinated material layer, a photoresist layer is applied, e.g., from a coating solvent or by lamination. The photoresist can be a conventional photoresist (positive or negative tone) coated from, or processed with, solvents that would normally be harmful to the underlying device substrate, but the base layer blocks penetration of such harmful materials. When exposed to appropriate radiation, and optionally heat, the photoresist transforms in some way to alter its solubility relative to unexposed photoresist. For example, exposure may activate solubility-altering switching groups, induce cross-linking or cause chain scission. The photoresist may optionally be a fluorinated photoresist provided from a fluorinated coating solvent so long as the underlying base layer retains at least some of its structural integrity, i.e., it is not dissolved too quickly by the coating solvent. Although such fluorinated photoresists may be generally benign, an additional layer of separation from the photoactive layer of photoresist can in some embodiments provide extra protection.

Figure 4:
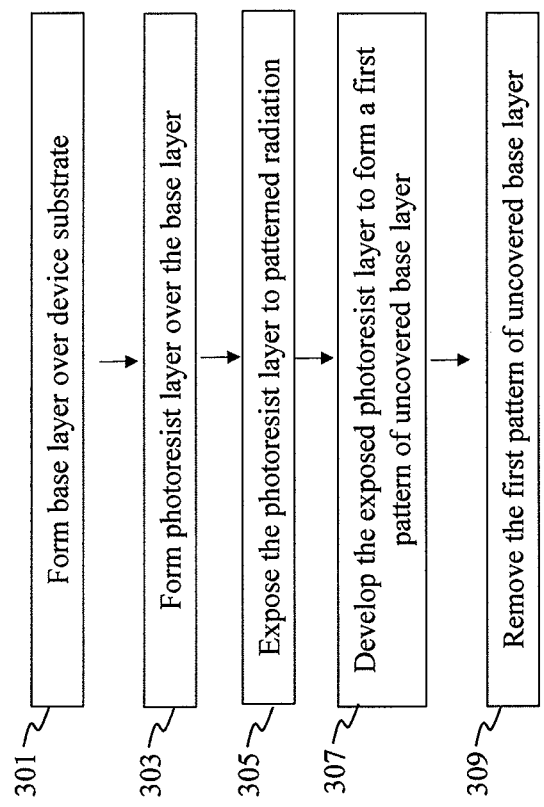
FIG. 4 is a flow chart depicting the steps in an embodiment of the present disclosure.
Figure 5A:
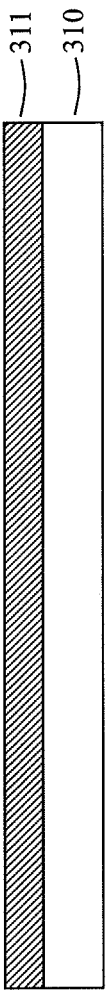
FIG. 5 is a series (5A-5E) of cross-sectional views depicting various stages in the formation of an undercut lift-off structure according to an embodiment of the present disclosure.
Figure 5B:
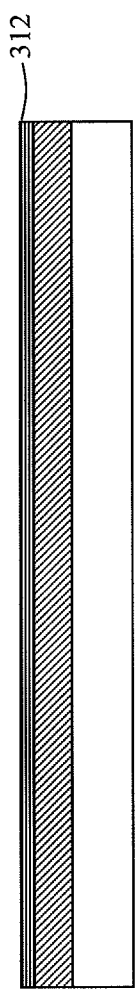
Figure 5C:
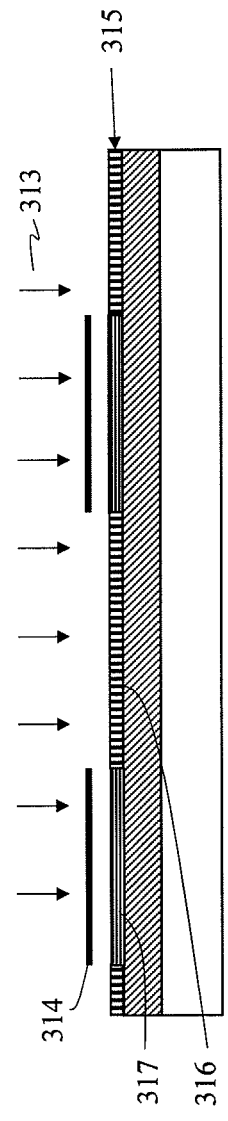
Figure 5D:
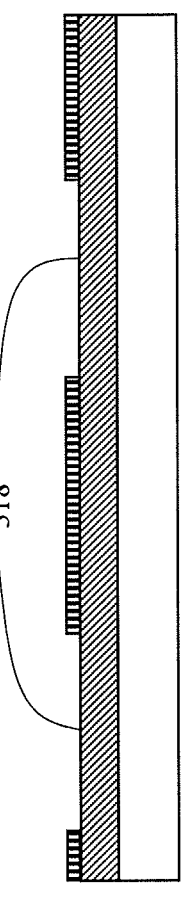
Figure 5E:
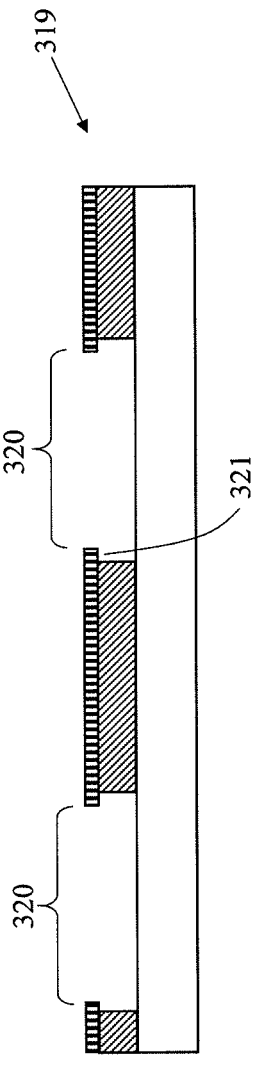

A flow diagram for an embodiment of forming a two-layer lift-off structure is shown in FIG. 4, and in cross-sectional view in FIG. 5. Such lift-off structures may be used in the embodiments described in FIGS. 2 and 3. In step 301, a base layer 311 is formed over device substrate 310. The base layer may undergo subsequent processing steps such as curing, drying, surface treatments or the like. In step 303 a photoresist layer 312 is formed over base layer 311. The photoresist layer may undergo drying or other steps prior to step 305 wherein the photoresist layer 312 is exposed to patterned radiation by providing a radiation source 313 and an intervening photomask 314. This forms an exposed photoresist layer 315 having a pattern of exposed photoresist regions 316 and a complementary pattern of unexposed photoresist regions 317. In this case the photoresist is a negative tone type, but a positive tone could be used instead. Other methods of photopatterning may optionally be used, e.g., projection exposure, patterned laser exposure and the like.

Next, as shown in step 307, the exposed photoresist layer is developed with a developing agent (e.g., an aqueous, alkaline developer if using many conventional photoresists), which in this embodiment, removes unexposed photoresist regions 316 to form a first pattern of uncovered base layer 318. In step 309, the first pattern of uncovered base layer is removed, for example, by using a fluorinated developing agent such as a hydrofluoroether to form lift-off structure 319 having a first pattern of openings 320. In this embodiment, the removal of the base layer forms an undercut region 321. After deposition of active materials, e.g., as described for an OLED device in FIGS. 2 and 3, the structure is subjected to a lift-off agent that dissolves the base layer. For example, if the base layer is a fluorinated material, the lift-off agent may be a fluorinated solvent, including but not limited to, hydrofluoroethers and perfluorinated solvents.

In many embodiments described above, a fluorinated photoresist or a fluorinated base layer may be coated or processed (e.g., development or lift-off) using a fluorinated solvent. Particularly useful fluorinated solvents include those that are perfluorinated or highly fluorinated liquids at room temperature, which are immiscible with water and many organic solvents. Among those solvents, hydrofluoroethers (HFEs) are well known to be highly environmentally friendly, "green" solvents. HFEs, including segregated HFEs, are preferred solvents because they are non-flammable, have zero ozone-depletion potential, lower global warming potential than PFCs and show very low toxicity to humans.

Examples of readily available HFEs and isomeric mixtures of HFEs include, but are not limited to, an isomeric mixture of methyl nonafluorobutyl ether and methyl nonafluoroisobutyl ether (HFE-7100), an isomeric mixture of ethyl nonafluorobutyl ether and ethyl nonafluoroisobutyl ether (HFE-7200 aka Novec™ 7200), 3-ethoxy-1, 1,1,2,3, 4,4,5,5,6,6,6-dodecafluoro-2-trifluoromethyl-hexane (HFE-7500 aka Novec™ 7500), 1,1,1,2,3,3-hexafluoro-4-(1,1,2,3, 3,3,-hexafluoropropoxy)-pentane (HFE-7600 aka PF7600 (from 3M)), 1-methoxyheptafluoropropane (HFE-7000), 1,1,1,2,2,3,4,5,5,5-decafluoro-3-methoxy-4-trifluoromethylpentane (HFE-7300 aka Novec™ 7300), 1,2-(1,1,2,2-tetrafluoroethoxy)ethane (HFE-578E), 1,1,2,2-tetrafluoroethyl-1H,1H,5H-octafluoropentyl ether (HFE-6512), 1,1,2, 2-tetrafluoroethyl-2,2,2-trifluoroethyl ether (HFE-347E), 1,1,2,2-tetrafluoroethyl-2,2,3,3-tetrafluoropropyl ether (HFE-458E), 2,3,3,4, 4-pentafluorotetrahydro-5-methoxy-2, 5-bis[1,2,2,2-tetrafluoro-1-(trifluoromethyl)ethyl]-furan (HFE-7700 aka Novec™ 7700), 1,1,1,2,2,3,3,4,4,5,5,6,6-tridecafluorooctane-propyl ether (TE6O-C3), $F(CF_2)_5$ $OCH_3$, $F(CF_2)_6OCH_3$, $F(CF_2)_7OCH_3$, $F(CF_2)_8$ $OCH_2CH_2CH_3$, $F(CF_2)_{20}(CF_2)_4OCH_2CH_3$, $F(CF_2)_3OCF$ $(CF_3)CF_2OCH_3$, $(CF_3)_2N(CF_2)_3OCH_3$,

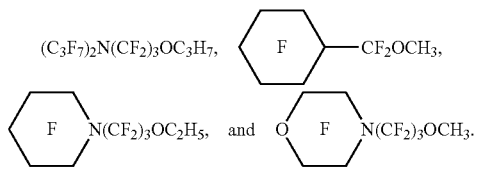

In an embodiment, the lift-off structure (single- or multi-layer type) absorbs or blocks underlying layers from at least 80% of any imaging radiation used in the formation of the lift-off structure.

In an embodiment, the photoresist portion of the lift-off structure is formed using a positive-type of photoresist. In this way, any underlying OLED devices or structures will not be exposed to potentially harmful imaging radiation.

Oxygen and Water Sensitivity

OLED devices are known in the art to have poor resistance to oxygen and water. Of particular concern are low work function cathode materials, the electron-rich dopants in an optional EIL and the interface between the cathode and the ETL or EIL. Referring to FIG. 2, for example, steps 105, 115, and 115 (deposit organic EL medium layers) along with steps 107, 117, and 119 (deposit top electrodes) may be done under a low pressure (vacuum) environment that has low oxygen and water. However, in such case, the substrate will likely be removed from the low pressure environment into an ambient environment for other steps relating to removal (lift-off) of lift-off structures and forming additional lift-off structures. Although one can design equipment for lift-off processing (coating, exposure, development, lift-off and the like) under nitrogen or other inert gas, additional precautions can be useful.

Figure 6:
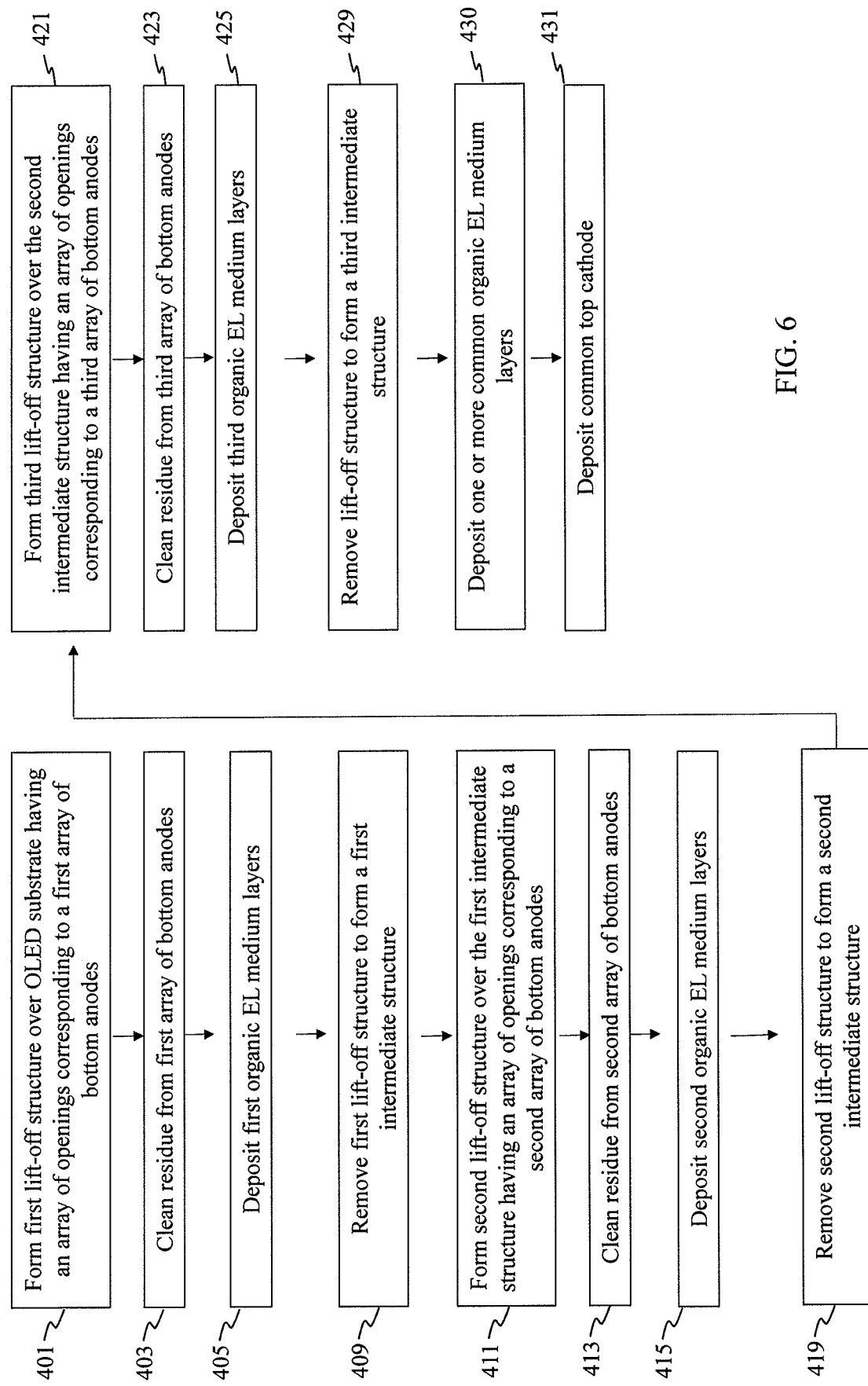
FIG. 6 is a flow chart depicting the steps in an embodiment of the present disclosure.
Figure 7:
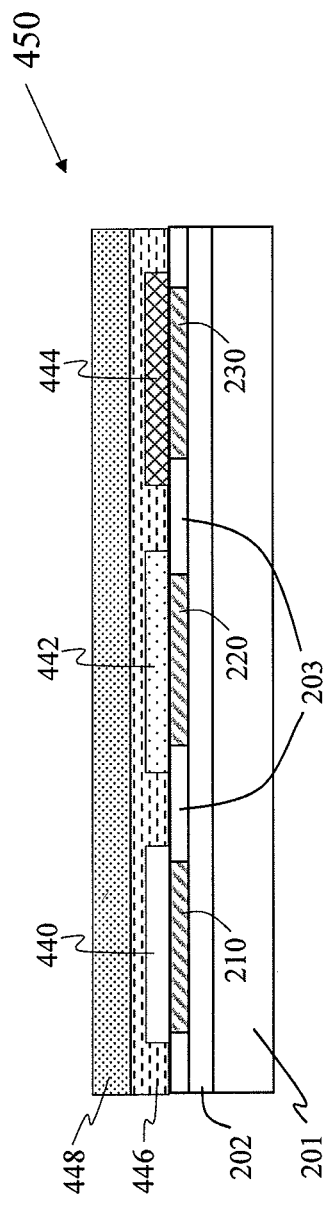
FIG. 7 is a cross-sectional view of an active matrix OLED device according to an embodiment of the present disclosure.

In an embodiment, rather than provide the full OLED structure including individual top electrodes for each emitting color as shown in FIGS. 2 and 3, only organic EL medium layers are provided. In a preferred embodiment, each OLED stack is provided up through at least its respective LEL, but does not include an EIL or any layers having electron rich dopants such as alkali metal, alkaline metal or alkaline earth metal dopants. For example, the OLED stack may be provided up to and including the HBL. A common cathode layer (and optional common organic EL medium layers such as EIL or ETL or both) can be applied at the end of the process and such common EIL/cathode layers will not be exposed to potential water and oxygen contamination that may arise in the lift-off related processes. This alternative process flow is shown in FIG. 6 and is in other respects the same as shown in FIG. 2. In FIG. 6, steps 401 through 431 correspond to steps 101 through 131 of FIG. 2, respectively. Relative to FIG. 2, the differences in FIG. 6 are: 1) the bottom electrodes are now referred to as bottom anodes; 2) the steps of depositing first, second and third top electrodes are absent; and 3) a new step 430 is introduced which has no counterpart in FIG. 2 whereby one or more common organic EL media layers are optionally deposited over the third intermediate structure. For comparative purpose, a cross-sectional view of an active matrix OLED 450 made in an embodiment according to FIG. 6 is shown in FIG. 7, which is analogous to FIG. 3J. In FIG. 7, reference numbers 201, 202, 203, 210, 220, and 230 are as described above for FIG. 3. In this embodiment, the first, second and third organic EL medium layers, 440, 442, and 444 include only layers other than an EIL. An optional common EIL layer 446 is provided over the organic medium layers and a common cathode 448 is provided over the common EIL layer. Although not shown, the substrate may have included common HIL and HTL layers as described previously. Prior to depositing the common top electrode, or alternatively, a common organic EL layer if that is included, the top surface of the patterned organic EL medium layers may be treated to improve contact with the common top electrode or common organic EL layer. This can help overcome contact resistance introduced by inadvertent layer damage or thin polymer residue that may be present on the organic EL medium surfaces. For example, the top surface of the organic EL medium layers may be treated with a low work function metal, e.g., an alkali metal, an alkaline metal or an alkaline earth metal. Typically, the low work function metal has a thickness of less 2 nm or less, alternatively 1 nm or less, or even 0.5 nm or less. Alternatively, treatment may include a reducing gas environment, e.g. a gas environment including hydrogen. Alternatively, treatment may include a substantially non-oxidizing plasma, e.g. one including hydrogen and another non-oxidizing gas such as nitrogen or helium. Alternatively, treatment may include contact with a cleaning agent having a chemical composition different from the lift-off agent, the cleaning agent including a fluorinated solvent For example, the cleaning agent may include a fluorinated solvent and a protic solvent such as an alcohol (e.g. IPA) at 15% or less by volume, alternatively 5% or less by volume. Alternatively, the protic solvent may include an organic acid at 5% or less by weight or alternatively 1% or less by weight. Alternatively, the cleaning agent may include a mixture of two fluorinated solvents, e.g., a mixture of a fluorinated solvent used in the lift-off agent and a second fluorinated solvent that is more polar or has less fluorine content by weight or both.

Figure 8:
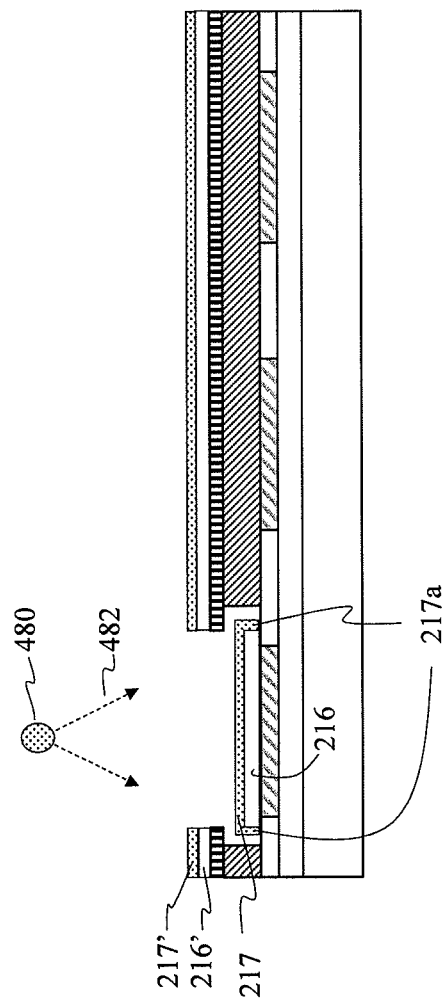
FIG. 8 is a cross-sectional view depicting a stage in the formation of an active matrix OLED device according to an embodiment of the present disclosure, wherein a top electrode is deposited so as to cover the edges of organic EL medium layers.

Referring again to FIGS. 2 and 3, in another embodiment, the top electrodes 217, 227 and 237 are provided in a manner so that they cover a slightly larger area than the organic EL medium layers. This can be done by reducing the collimation of the top electrode deposition e.g., by moving the top electrode source closer to the substrate as shown in FIG. 8. This allows the top electrode material to extend beyond the edges of the OLED and help seal the exposed edges to protect from water and oxygen penetration. In FIG. 8, top electrode source 480 is positioned so that top electrode material 482 emitted from the source is not highly collimated and deposits a first top electrode 217 that, in this embodiment, includes top electrode portion 217*a* that extends over the sides of organic EL medium layers 216. All other reference numbers in FIG. 8 are as described previously with respect to FIG. 3. A top electrode material should be of a material and thickness so that it is relatively inert itself to water and oxygen penetration, or able to form a non-harmful, inert oxide barrier layer. For example, the top electrode may comprise aluminum or metal oxide that is at least 50 nm, preferably at least 100 nm thick. The top electrode in this embodiment may be a cathode or anode. In this embodiment, the organic EL medium layers should be deposited in an area at least as large as the bottom electrode, preferably larger, and it is preferred that the substrate include a bottom electrode-defining dielectric. This will prevent shorting of the two electrodes.

In a manner similar to FIG. 8, but with respect to FIGS. 6 and 7, rather than a top electrode having a larger area, the top layer of the organic EL media layers can be provided to cover the edges of underlying organic EL media layers. In a non-limiting example, the top organic EL media layer of an individual stack is a hole-blocking layer that is provided in an area slightly larger than the underlying layers, e.g., to protect edges of the LEL or other layers which may be more water or oxygen sensitive than the HBL. This can also be done by selecting conditions for top organic EL media layer deposition that are less collimated than underlying layers.

Referring again to FIGS. 2 and 3, in an embodiment the OLED arrays each have an inverted structure wherein the cathode is the bottom electrode and the anode is the top electrode. The top anode may further be provided to cover the edges of the organic EL medium as described in FIG. 8. With the inverted structure, the sensitive EIL and cathode/EIL are at the bottom and further away from the lift-off structure, its associated chemistry and potential adventitious water and oxygen thereby providing a more robust structure.

Referring again to FIGS. 2 and 3, in an embodiment, a fluorinated material layer is vapor deposited after deposition of the first or second top electrodes or both, i.e., after step 107, but before step 109, or after step 117, but before step 119. In this embodiment, the organic EL medium and top electrodes are deposited in a reduced pressure (vacuum) environment as discussed previously. The vapor deposited fluorinated material layer can serve as a temporary barrier to water, or as a buffer layer against physical damage from handling, when the substrate is transferred to more ambient pressure conditions for lift-off processing. An example structure is shown in cross sectional view in FIG. 9 which is identical to FIG. 3C with the exception of the additional vapor deposited fluorinated material layer 490 and 490'. In an embodiment, the fluorinated material layer is chosen to dissolve in the lift-off solvent. In an alternative embodiment, the fluorinated material layer is selected so that it does not dissolve in the lift off solvent, but rather, remains over the active OLED device and is lifted off in the photoresist portions along with the unnecessary OLED and top electrode materials as described earlier. Prior to deposition of the common top electrode, however, the fluorinated material layer should be removed in an orthogonal solvent other than the lift-off solvent from steps 109 and 119. For example, the lift off solvent may be a first hydrofluoroether and the fluorinated material layer removal step may use a different hydrofluoroether or a perfluorinated solvent, or vice versa and the lift-off solvent is a perfluorinated solvent.

In a similar embodiment and referring to FIGS. 6 and 7, vapor deposited fluorinated material layer may be provided after deposition of the organic EL medium layers, e.g., after step 405 but before step 409. As before, the fluorinated material layer may be chosen to dissolve in the lift-off solvent, or alternatively, the fluorinated material layer is selected so that it does not dissolve in the lift off solvent. If the latter, prior to deposition of the common top electrode and any common organic layers, the fluorinated material layer should be removed in an orthogonal solvent other than the lift-off solvent from steps 109 and 119.

Referring again to FIGS. 2 and 3, one or more of the lift-off structures has a multi-layer structure, e.g., the two-layer structure shown in FIG. 3 and further illustrated in FIG. 5. In an embodiment, the lift-off structure is removed by using lift-off agent comprising a fluorinated solvent having a density greater than the effective density of the photoresist layer plus overlying organic EL medium layers and the cathode. In this context, "effective density" is the total mass of the photoresist layer plus any overlying layers divided by the volume of such photoresist layer and overlying layers. This simplifies removal of the photoresist layer (plus overlying layers) and encourages separation of such layers by enabling these layers to quickly rise to the top surface of a lift-off agent liquid. This can speed lift-off and also reduce the chance that possible debris from the lift-off materials will damage the remaining OLED structure. By concentrating such debris near the surface of the lift-off agent liquid, a processing machine can be designed to readily filter out the debris.

Referring again to FIGS. 2 and 3, in an embodiment, the photoresist or cathode is selected to have some residual stress that encourages the lift-off portion to curl during lift off. This curling action can more quickly expose fresh base layer thereby speeding up the lift-off step. In an embodiment, the curl force induces an arc of at least 180° in at least a portion of the lift-off structure. In an embodiment, the curl force induces an arc of at least 360° in at least a portion of the lift-off structure, i.e., at least a portion of the lift-off structure rolls up on itself.

Referring again to FIGS. 2 and 3, in an embodiment, the cathode is selected to have some magnetic properties so that a magnet in a lift-off agent bath can attract the removed portion. This can speed up lift off and also reduce the chance that possible debris from the lift-off materials will damage the remaining OLED structure.

Figures 9, 10A, 10B:
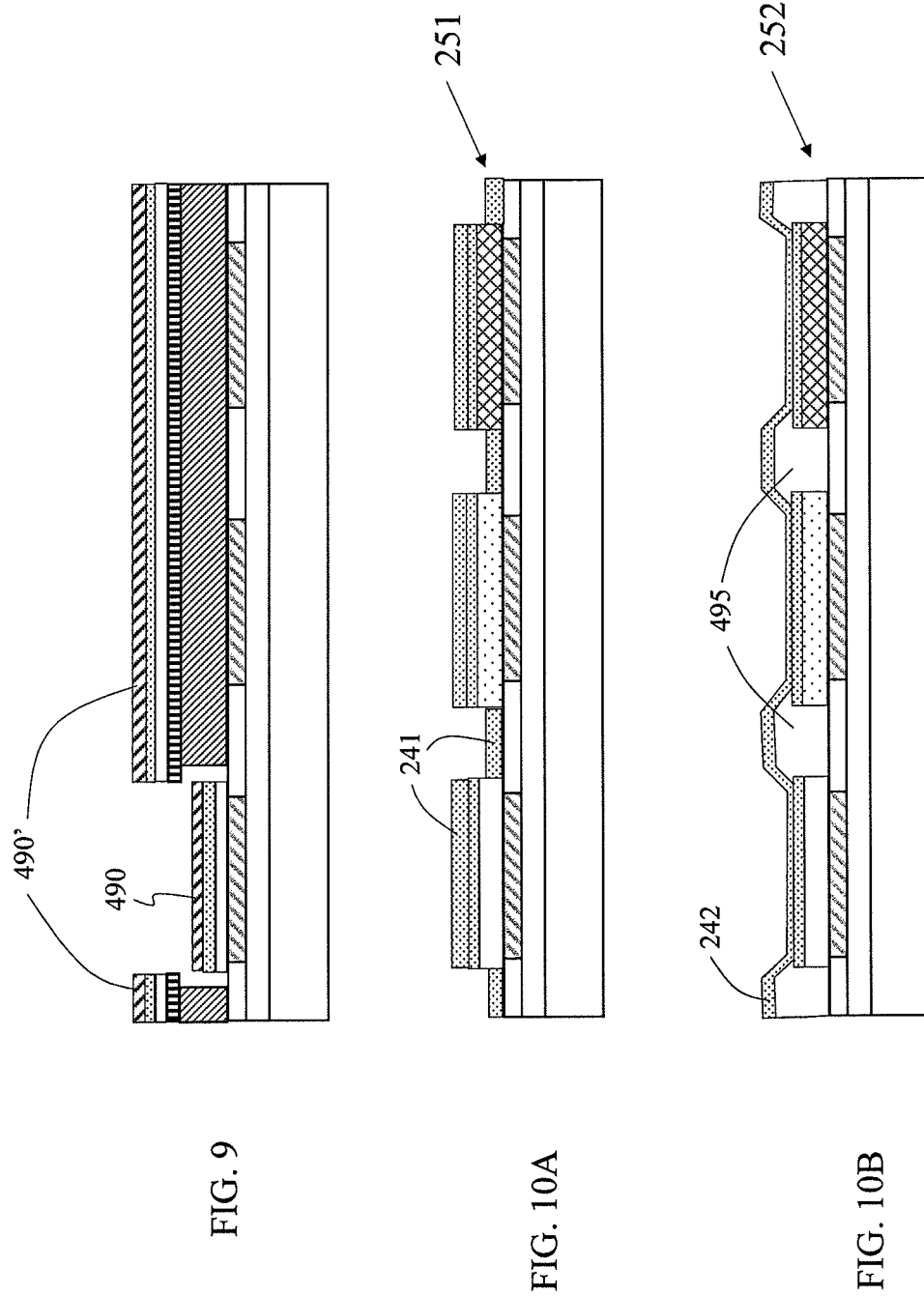
FIG. 9 is a cross-sectional view depicting a stage in the formation of an active matrix OLED device according to an embodiment of the present disclosure, wherein a vapor-deposited layer of a fluorinated material is provided.
FIG. 10A is a cross-sectional view depicting a defective active matrix OLED device wherein the top common electrode has poor electrical connectivity between individual OLED devices.
FIG. 10B is a cross-sectional view depicting an active matrix OLED device according to an embodiment of the present disclosure including a patterned fluorinated dielectric structure.

Referring to FIGS. 3J and 3K, it is possible that the common top electrode deposition might not go as drawn. If the common top electrode is thinner than the organic EL thickness, there is chance for a discontinuity as shown in FIG. 10A, which is otherwise the same as FIG. 3K except that the thin common top electrode 241 does not readily connect the other top electrodes. This may produce a defective active matrix OLED device, 251. Further, even as drawn in FIG. 3K, there is a chance for shorting between the top and bottom electrodes. In an embodiment, a patterned dielectric layer is provided after forming the third intermediate structure to aid the deposition of the common top electrode. Such patterned dielectric may be provided from a fluorinated photopolymer from a fluorinated solvent, e.g., a cross-linking fluorinated polymer as described in International Application Nos. PCT/US2014/047800 and PCT/US2015/014425, exposing and developing in an orthogonal developing agent. As shown in FIG. 10B, the patterned (optionally fluorinated) dielectric 495 is provided over third intermediate structure 238 that is otherwise the same as that shown in FIG. 3J. The patterned dielectric 495 has a relatively gentle slope to ensure good contact between the top electrodes of each OLED array and the common top electrode 242, even if the common top electrode is thinner than the organic EL medium thickness. Further, there is now considerable separation between the top electrode and bottom electrodes, reducing the chance for shorts. The array of patterned openings in the dielectric (sometimes referred to as a "pixel definition layer" or PDL) generally defines the display region of a display device.

Referring again to FIGS. 2 and 3, in an embodiment, the lift-off structures employ a negative type photoresist and the top electrodes are substantially opaque to patterning radiation. In this way, underlying organic EL media layers are protected from potentially harmful radiation such as UV light.

In the embodiments described in FIGS. 2 and 6, three lift-off structures are fabricated to pattern three different colors. In an alternative embodiment, only two lift-off structures are used as described in FIGS. 11 and 12A-12J.

In step 501, third organic EL medium layers (e.g. for a red-emitting OLED) are deposited over an OLED substrate having first, second and third arrays of bottom electrodes. The third organic EL medium layers will eventually be used to form an OLED over the third array of bottom electrode. This is shown in cross-sectional view in FIG. 12A wherein an OLED substrate (having first, second and third arrays of bottom electrodes) is provided as described previously in FIG. 3A and the third organic EL medium layers 636 are commonly deposited over all of the arrays of electrodes. A top electrode is not provided at this time. In an embodiment, the third organic EL medium is easily dry-etched and does not include substantial amounts of metal-containing materials in its LEL, optional HBL or optional ETL, e.g., aluminum quinolate complexes or phosphorescent iridium dopants.

Figure 12A:
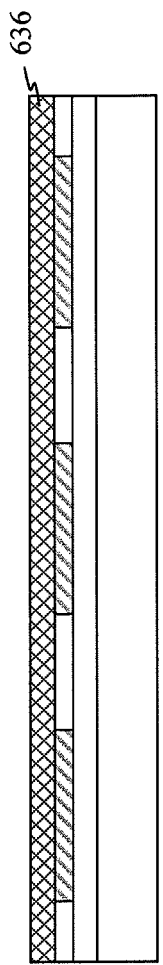
FIG. 12 is a series (12A-12J) of cross-sectional views depicting various stages in the formation of an active matrix OLED device according to an embodiment of the present disclosure.
Figure 12B:
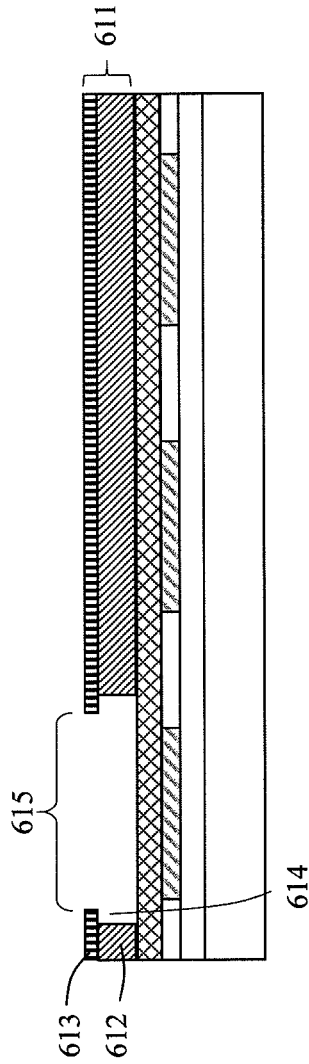

In step 503, over the third organic EL medium layers a first lift-off structure is formed having an array of openings corresponding to a first array of bottom electrodes. FIG. 12B shows a first lift-off structure 611 having an opening 615 corresponding to a first bottom electrode. In the embodiment shown here, the first lift-off structure 611 is a bilayer of first material layer 612 and first patterned photoresist layer 613. An undercut region 614 is formed in layer 612. The first lift-off structure 611 may instead be a single layer or have more than two layers.

Figure 12C:
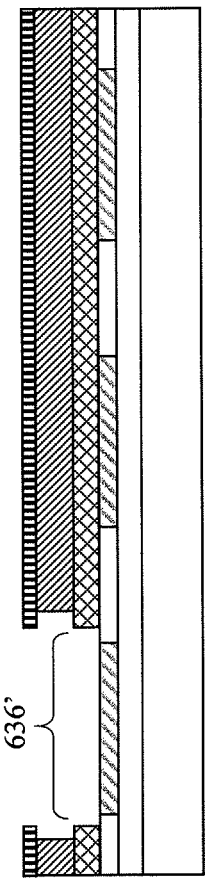

In step 505 the first-lift off structure is used as an etch mask for etching the third organic EL medium layers. These layers are etched in a pattern corresponding to the first array of bottom electrodes. As shown in FIG. 12C, the removed portion 636' of the third organic EL medium layers exposes the first array of bottom electrodes for subsequent OLED deposition steps as described below. Methods of etching include those mentioned above with respect to dry-etching. In an embodiment, the electrode-separating dielectric 203 (see FIG. 3A) is more etch resistant than the organic EL medium layers.

Figures 12D, 12E, 12F:
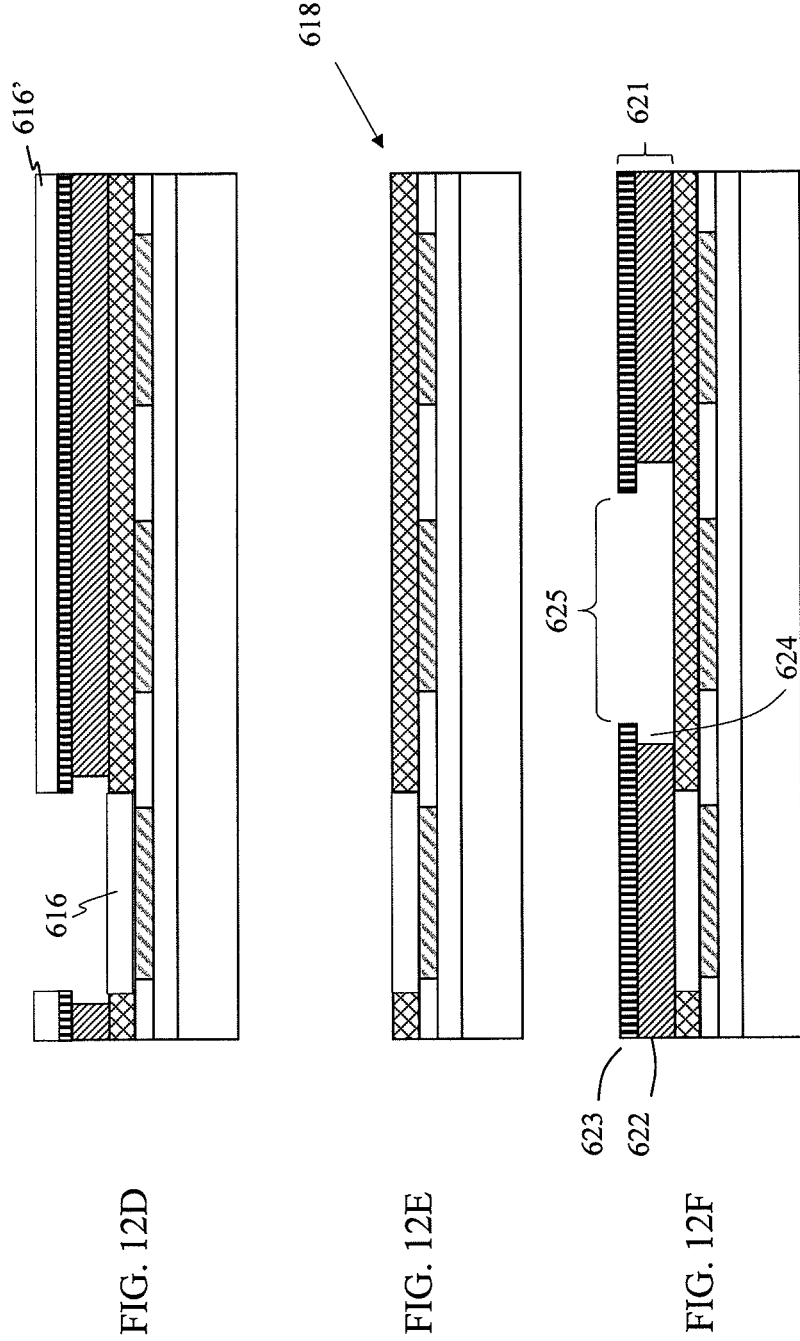

In step 507, first organic EL medium layers (e.g., for a green-emitting OLED) are deposited. As shown in FIG. 12D, a portion of the first organic EL medium layers 616' is deposited over the lift-off structure whereas another portion of the first organic EL medium layers 616 goes through the opening 615 and is deposited on the first array of bottom electrodes. Although not shown in the present embodiment, a first top electrode may optionally be deposited over the first organic EL medium layers in a manner similar to that shown in FIG. 3C.

In step 509, the first lift-off structure is removed to form a first intermediate structure 618 as shown in FIG. 12E. In step 511, a second lift-off structure 621 having an array of openings 625 corresponding to the second array of bottom electrodes is formed over the first intermediate structure. In the embodiment shown here in FIG. 12F, the second lift-off structure 621 is a bilayer of second material layer 622 and second patterned photoresist layer 623. An undercut region 624 is formed in layer 622. The second lift-off structure 621 may instead be a single layer or have more than two layers.

In step 513 the second-lift off structure is used as an etch mask for etching the first organic EL medium layers. These layers are etched in a pattern corresponding to the second array of bottom electrodes. As shown in FIG. 12G, the removed portion 636" of the first organic EL medium layers exposes the first array of bottom electrodes for subsequent OLED deposition steps as described below. Methods of etching include those mentioned above with respect to dry-etching. In an embodiment, the electrode-separating dielectric 203 (see FIG. 3A) is more etch resistant than the organic EL medium layers.

In step 515, second organic EL medium layers (e.g., for a blue-emitting OLED) are deposited. As shown in FIG. 12H, a portion of the second organic EL medium layers 626' is deposited over the lift-off structure whereas another portion of second third organic EL medium layers 626 goes through the opening 625 and is deposited on the second array of bottom electrodes. Although not shown in the present embodiment, a second top electrode may optionally be deposited over the second organic EL medium layers in a manner similar to that shown in FIG. 3C.

In step 517, the second lift-off structure is removed to form a second intermediate structure 628 as shown in FIG. 12I. In steps 519, one or more common organic EL medium layers 646 are optionally provided over the second intermediate structure and in step 521 a common electrode 648 is provided thereby forming active matrix OLED device 650. FIG. 12J shows the embodiment with the optional common organic EL medium layer(s) 646. When a common organic EL medium is intended for deposition, first and second top electrodes should not be deposited over the first and second organic EL medium layers. The top surfaces of patterned organic EL medium layers may optionally be cleaned or treated as previously described with respect to FIGS. 6 and 7.

Figure 11:
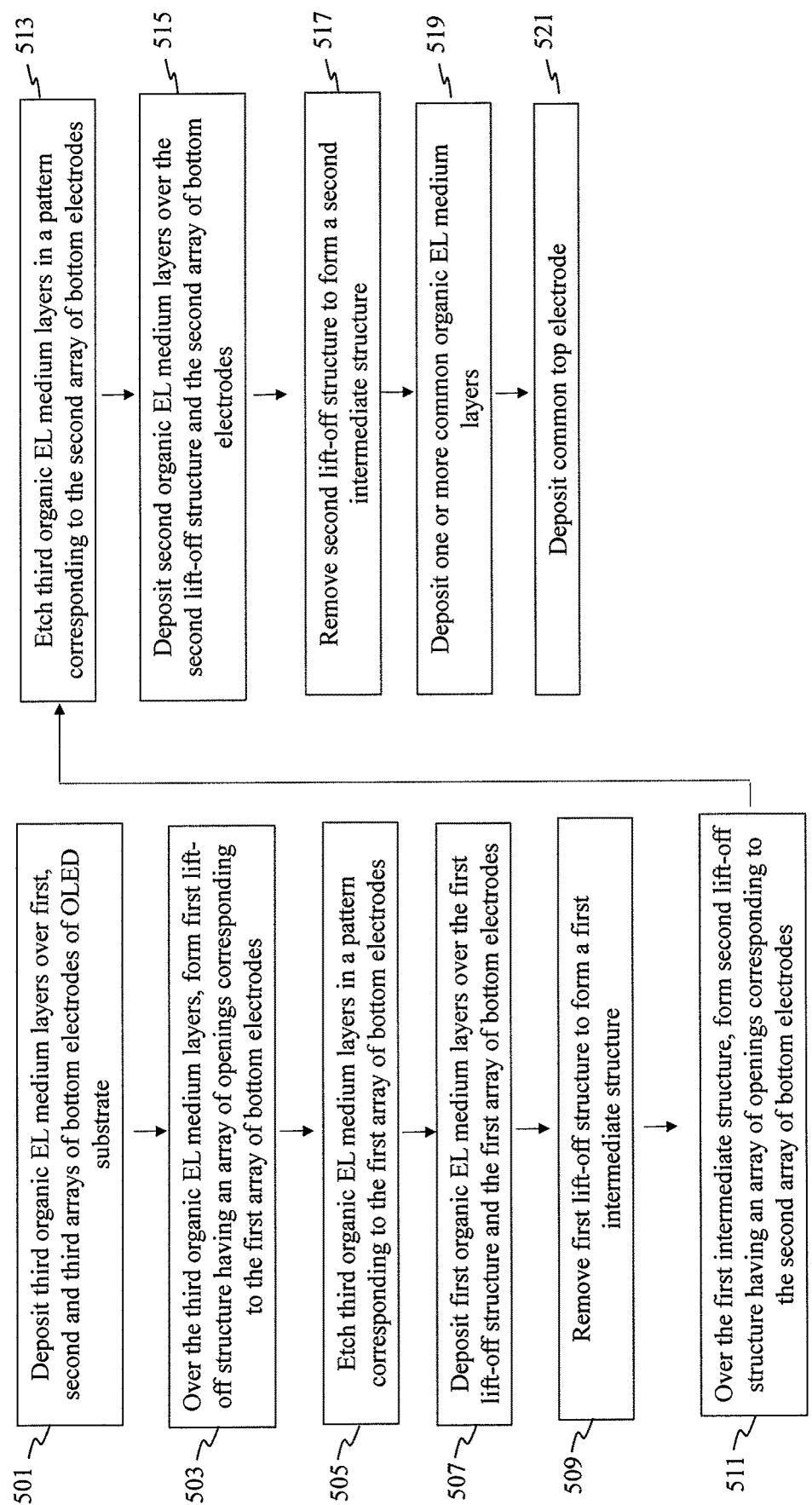
FIG. 11 is a flow chart depicting the steps in an embodiment of the present disclosure.

Referring to FIGS. 11 and 12, in an embodiment, each OLED stack is provided up through at least its respective LEL, but does not include an EIL or any layers having electron rich dopants such as alkali metal, alkaline metal or alkaline earth metal dopants. For example, the OLED stack may be provided up to and including a hole-blocking layer. It should also be noted that third organic EL medium layers may be provided in interstitial areas between the first and second organic EL medium layers. This can be advantageous for providing a uniform surface for the deposition of subsequent common layers. It also may help prevent shorts in the event that a device has a defect (e.g. in the PDL or in the patterning of other colors) that exposes an unintended area of a bottom electrode. The third organic EL medium layers would cover such defect, and although it may slightly reduce the color purity of a defective pixel if it was intended to emit colors from the first or second organic EL medium layers, it would more importantly light up upon application of an appropriate voltage rather than producing a dark spot.

Referring again to FIGS. 11 and 12, in an embodiment, one or more of the third organic EL medium layers are coated from solution. In an embodiment, one or more of the third and first organic EL medium layers are coated from solution. In an embodiment, the third organic EL medium includes a light-emitting layer deposited from solution (e.g., a polymeric LEL) whereas the first organic EL medium or second organic EL medium or both includes an LEL provided by vapor deposition.

Those skilled in the art will recognize that many of the embodiments described above with respect to FIGS. 2, 3, 6 and 7 can be applied in a similar fashion with respect to the embodiments of FIGS. 11 and 12. An advantage of the embodiments shown in FIGS. 11 and 12 is that only two lift-off steps are required for a three-color OLED.

Figures 13A, 13B, 13C, 13D:
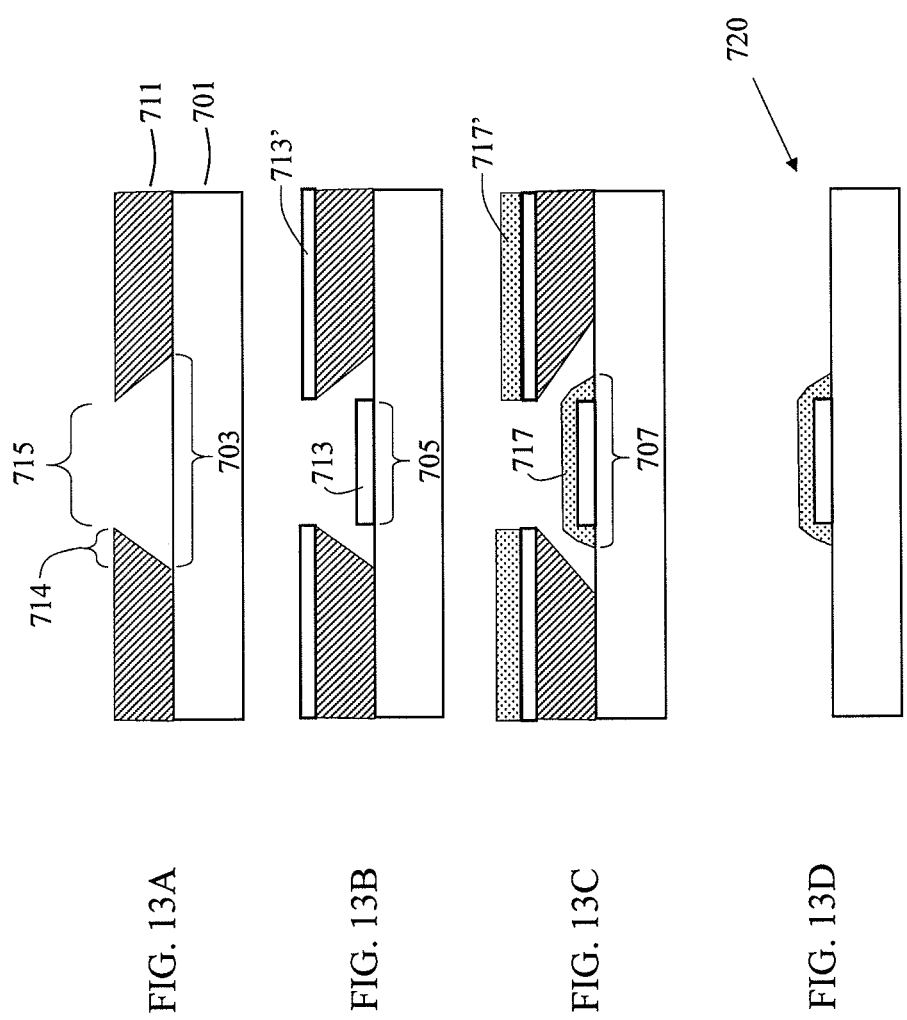
FIG. 13 is a series (13A-13D) of cross-sectional views depicting various stages in the formation of an organic device according to an embodiment of the present disclosure.

FIGS. 13A through 13D shows a series of cross-sectional views in another embodiment of forming an organic device. In FIG. 13A, a device substrate 700 is provided, which may optionally be flexible and may optionally include a support layer (e.g. as described above for OLEDs) in addition to other layers and features necessary to provide a desired organic device. For example, the organic device may be an OLED, a display, a lighting device, a chemical sensor, a touch sensor, a photovoltaic, a TFT backplane, or a bioelectronic or medical device.

Over the device substrate 700 is provided a first undercut lift-off structure 711 having a first opening 715 and forms an area of uncovered device substrate 703. The lift-off structure may include any of those previously discussed so long as there is an undercut. In the embodiment of FIG. 13A, the first undercut lift-off structure 711 is a single layer having undercut region 714, e.g., a patterned fluorinated photoresist developed using a fluorinated solvent. Alternatively, the undercut lift-off structure could instead comprise two or more patterned layers, e.g., including a fluorinated material base layer and an overlying photoresist layer wherein the fluorinated material base layer is undercut relative to the photoresist layer.

As shown in FIG. 13B, a first active organic material layer is then deposited over the first undercut lift-off structure and over a first portion 705 of the area of uncovered device substrate. The active organic material deposited over the lift-off structure is shown as 713' and the active organic material deposited over the first portion is shown as 713. In an embodiment, the first active organic material layer is vapor-deposited in a reduced-pressure environment with a reasonable amount of collimation so that the material is deposited in an area similar in size to opening 715. Alternatively, rather than depositing the first active organic material directly, a growth catalyst, an adhesion promoter or a linking group is provided over the first portion 705 by a collimated means and the first active organic material layer is selectively deposited from solution or other non-collimated vapor phase in the areas occupied by the growth catalyst, adhesion promoter or linking group. The first active organic material layer may include, for example, an organic conductor, an organic semiconductor, a charge transport material, a light-emitting material, or a biological material. In an embodiment, the first active organic material layer is sensitive to water or oxygen or both.

Referring to FIG. 13C, a second material layer is deposited over the first active organic material layer and over a second portion 707 of the area of uncovered substrate. The second material layer deposited over the lift-off structure is shown as 717' and the second material layer deposited over the second portion is shown as 717. The second portion area is larger than the first portion area and so the second material layer 717 extends beyond and covers the sidewalls of the first active organic material layer 713 in the first portion. The second material layer may be deposited from solution or by vapor deposition so long as the vapor is not so highly collimated that it limits the second portion area to the degree that it prevents or limits coverage of the second material layer over the sidewalls of the first active organic material layer. Alternatively, rather than depositing the second material layer directly, a growth catalyst, an adhesion promoter or a linking group is provided over regions other than the sidewalls of the lift-off structure, and the second material layer is then selectively deposited from solution or other vapor phase in the areas occupied by the growth catalyst, adhesion promoter or linking group.

In an embodiment, the second material layer is electrically conductive. For example, the second material layer may include an organic conductor, a metal, a metal oxide, graphene or graphene-oxide. In an embodiment, the second material layer comprises a second active organic material different from the first active organic material layer. For example, this second active organic material may include an upper layer in an organic EL media stack such as a charge transport material or light emitting material, or it may include a biological material or an organic semiconductor. In an embodiment, the second material layer is later removed and does not form part of the organic device in its final form. For example, the second material layer may include a fluorinated material. In an embodiment, the second material layer is less sensitive to water or oxygen, or both, than the first active organic material layer. In an embodiment, the second material layer at least partially protects the first active organic material layer from water or oxygen or both, for example, by slowing the ingress of water or oxygen.

As shown in FIG. 13D, the first undercut lift-off structure is removed, e.g., by methods described previously, thereby forming an intermediate structure or organic device 720 having a patterned first active organic material layer and a patterned second material layer over the substrate. The first opening may optionally be part of a first array of openings having a first pattern. Further, the substrate may optionally include a first array of bottom electrodes in alignment with the first openings.

As described, a lift-off structure may include a fluorinated material base layer and a photoresist wherein the fluorinated material base layer acts as a lift-off layer. In an embodiment, the lift-off agent comprises a fluorinated solvent, e.g., a perfluorinated solvent or a hydrofluoroether, and a film-forming, lift-off fluorinated material that may be the same as or different from the fluorinated material used in the fluorinated material base layer. For example, an intermediate device structure may be formed from the lift-off step and the intermediate structure is intended for further processing. By including a lift-off fluorinated material in the lift-off solvent, a protective layer of the lift-off fluorinated material is formed upon evaporation or drying. This can protect underlying sensitive structures from adventitious contaminants and physical damage that may occur during storage or transfer to other processing stations.

In an embodiment, the lift-off fluorinated material is the same as the fluorinated material of the fluorinated material base layer and at least a portion of the lift-off fluorinated material in the lift-off agent is a seasoning byproduct of the lift-off step that is deliberately allowed to build up. In other words, rather than removing dissolved fluorinated material from a lift-off processing tank or providing multiple washes to remove residual fluorinated material, a layer of such lift-off fluorinated material is deliberately allowed to form on a patterned device structure surface. In an embodiment, the dried lift-off fluorinated material has a thickness in a range of 10 nm to 1000 nm thick, alternatively 50 nm to 500 nm. In an embodiment, the layer of lift-off fluorinated material is thick enough to be used as a subsequent base layer in the fabrication of another lift-off structure for further patterning. In an embodiment, the layer of lift-off fluorinated material is largely dissolved into a subsequent fluorinated material base layer coating and becomes part of the new fluorinated material base layer.

For example, shown in FIG. 14A is a structure identical to that described for FIG. 3F, and in particular, the second material layer 222 is a fluorinated material. When contacted with a lift-off agent comprising a lift-off fluorinated material, rather than forming the intermediate structure 228 of FIG. 3G, the intermediate structure 228A of FIG. 14B is formed having a lift-off fluorinated material layer 222A. In an embodiment, this may be used to form a base layer, or a portion of a base layer, in another lift-off structure.

The lift-off fluorinated material can be added to a lift-off process replenishment supply. Alternatively, the lift-off fluorinated material can be provided by seasoning a lift-off processing tank that allows build-up of a fluorinated material from the lift-off structure, preferably in conjunction with a replenishment system and a recirculation system for filtering insoluble lift-off portions. In addition to adding protection, it can save money by reducing the volume of fresh lift-off agent consumed. When all the patterning steps are done, however, the intermediate structure should be cleaned with fresh lift-off agent or treated in ways previously described to remove residue prior to deposition of any common organic EL layers or a common top electrode.

Some non-limiting embodiments of the present disclosure are defined below.

1. A method of making an OLED device comprising:
   a) providing a device substrate having a first array of bottom electrodes and a second array of bottom electrodes;
   b) providing a first undercut lift-off structure over the device substrate having a first pattern of openings corresponding to the first array of bottom electrodes;
   c) depositing one or more first organic EL medium layers, including at least a first light-emitting layer, and a first top electrode layer over the first undercut lift-off structure and over the first array of bottom electrodes;
   d) removing the first undercut lift-off structure and overlying first organic EL medium layer(s) and first top electrode to form a first intermediate structure;
   e) providing a second undercut lift-off structure over the first intermediate structure having a second pattern of openings corresponding to the second array of bottom electrodes;
   f) depositing one or more second organic EL medium layers, including at least a second light-emitting layer, and a second top electrode over the second undercut lift-off structure and over the second array of bottom electrodes;
   g) removing the second undercut lift-off structure and overlying second organic EL medium layer(s) and second top electrode to form a second intermediate structure; and
   h) providing a common top electrode to electrically connect the first and second top electrode layers.

2. The method of embodiment 1 wherein at least one lift-off structure includes at least two patterned layers including a fluorinated material base layer and an overlying photoresist layer, wherein the fluorinated material base layer is undercut relative to the photoresist layer.

3. The method of embodiment 1 wherein at least one lift-off structure includes a patterned fluorinated photoresist developed using a fluorinated solvent and having an undercut profile.

4. The method according to any of embodiments 1-3 further including a dry-etch cleaning step between steps (b) and (c) or between steps (e) and (f) or both.

5. The method according to any of embodiments 1-4 wherein at least one lift-off structure absorbs or blocks underlying layers from at least 80% of imaging radiation used in the formation of the lift-off structure.

6. The method according to any of embodiments 1-5 wherein at least one lift-off structure comprises a negative tone photosensitive film that absorbs or blocks at least 80% of imaging radiation and wherein the first or second top electrodes or both absorb or block at least 80% of any imaging radiation that passes through an overlying lift-off structure.

7. The method according to any of embodiments 1-6 wherein the effective density of at least one lift-off structure with its corresponding overlying organic EL medium layers and overlying top electrode layer is less than the density of a lift-off agent used to remove the lift-off structure.

8. The method according to embodiment 7 wherein the lift-off agent comprises a fluorinated solvent.

9. The method according to any of embodiments 1-8 wherein the bottom electrodes act as cathodes and the top electrodes act as anodes.

10. The method according to any of embodiments 1-9 wherein at least one top electrode is deposited so that it covers the sidewalls of underlying organic EL medium layers.

11. The method according any of embodiments 1-10 further including vapor depositing a fluorinated material over a top electrode between steps (c) and (d), or between steps (f) and (g), or both.

12. The method according to any of embodiments 1-11 wherein one or more lift-off structures curls during its removal in a lift-off agent.

13. The method according to any of embodiments 1-12 further comprising, prior to step (h), providing a third undercut lift-off structure over the second intermediate structure having a third pattern of openings corresponding to a third array of bottom electrodes;
depositing one or more third organic EL medium layers, including at least a third light-emitting layer, and a third top electrode over the third undercut lift-off structure and over the third array of bottom electrodes;
removing the third undercut lift-off structure and overlying third organic EL medium layer(s) and third top electrode to form a third intermediate structure.

14. The method according to any of embodiments 1-13 further comprising, prior to step (h), cleaning the surface of the top electrodes of residual fluorinated material.

15. The method according to embodiment 14 wherein the cleaning comprises contact with a cleaning agent having a chemical composition different from the lift-off agent, the cleaning agent comprising a fluorinated solvent.

16. The method according to embodiment 14 or 15 wherein the cleaning comprises dry etching.

17. The method according to embodiment 16 wherein the dry etching includes an argon plasma, oxygen plasma or a substantially non-oxidizing plasma.

18. The method according to any of embodiments 1-17 wherein at least one lift-off structure includes at least two patterned layers including a fluorinated material base layer and an overlying photoresist layer, the overlying photoresist layer provided from a photoresist composition comprising a fluorinated coating solvent.
19. The method according to embodiment 18 wherein the photoresist layer comprises a fluorinated photoresist.
20. The method according to embodiment 18 or 19 wherein the fluorinated material base layer includes a cyclic perfluorinated polymer and the fluorinated coating solvent is a hydrofluoroether.
21. The method according to any of embodiments 1-20 further including, prior to step (h) treating the top electrodes with a low work-function metal, a reducing gas environment or a substantially non-oxidizing plasma.
22. A method of making an OLED device comprising:
a) providing a device substrate having a first array of bottom electrodes and a second array of bottom electrodes;
b) providing a first undercut lift-off structure over the device substrate having a first pattern of openings corresponding to the first array of bottom electrodes;
c) depositing one or more first organic EL medium layers including at least a first light-emitting layer over the first undercut lift-off structure and over the first array of bottom electrodes;
d) removing the first undercut lift-off structure and overlying first organic EL medium layer(s) by treatment with a first lift-off agent comprising a fluorinated solvent to form a first intermediate structure;
e) providing a second undercut lift-off structure over the first intermediate structure having a second pattern of openings corresponding to the second array of bottom electrodes;
f) depositing one or more second organic EL medium layers including at least a second light-emitting layer over the second undercut lift-off structure and over the second array of bottom electrodes;
g) removing the second undercut lift-off structure and overlying second organic EL medium layer(s) by treatment with a second lift-off agent comprising a fluorinated solvent to form a second intermediate structure; and
h) providing a common top electrode in electrical contact with the first and second organic EL medium layers.
23. The method of embodiment 22 wherein at least one lift-off structure includes at least two patterned layers including a fluorinated material base layer and an overlying photoresist layer wherein the fluorinated material base layer is undercut relative to the photoresist layer.
24. The method of embodiment 22 wherein at least one lift-off structure includes a patterned fluorinated photoresist developed using a fluorinated solvent and having an undercut profile.
25. The method according to any of embodiments 22-25 further including a dry-etch cleaning step between steps (b) and (c) or between steps (e) and (f) or both.
26. The method according to any of embodiments 22-25 wherein at least one lift-off structure absorbs or blocks underlying layers from at least 80% of imaging radiation used in the formation of the at least one lift-off structure.
27. The method according to any of embodiments 22-26 wherein the effective density of at least one lift-off structure with its corresponding overlying organic EL medium layers is less than the density of the corresponding liquid lift-off agent used to remove the lift-off structure.
28. The method according to embodiment 27 wherein at least one lift-off agent comprises a hydrofluoroether.
29. The method according to any of embodiments 22-28 wherein the bottom electrodes act as cathodes and the common top electrode acts as a respective anode.
30. The method according to any of embodiments 22-29 wherein at least one top organic EL medium layer is deposited so that it covers the sidewalls of one or more underlying organic EL medium layers.
31. The method according any of embodiments 22-30 further including vapor depositing a fluorinated material over the organic EL medium layers between steps (c) and (d), or between steps (f) and (g), or both.
32. The method according to any of embodiments 22-31 wherein one or more lift-off structures curls during its removal in the lift-off agent.
33. The method according to any of embodiments 22-32 further comprising, prior to step (h), providing a third undercut lift-off structure over the second intermediate structure having a third pattern of openings corresponding to a third array of bottom electrodes;
depositing third organic EL medium layers including at least a third light-emitting layer over the third undercut lift-off structure and over the third array of bottom electrodes;
removing the third undercut lift-off structure and overlying third organic EL medium layer(s) by treatment with a third lift-off agent comprising a fluorinated solvent to form a third intermediate structure;
34. The method according to any of embodiments 22-33 further comprising depositing a common organic EL layer prior to depositing the common top electrode.
35. The method according to any of embodiments 22-34 further comprising, prior to depositing the common top electrode, or in the case of embodiment 34, prior to depositing the common organic EL layer, cleaning the intermediate structure of residual fluorinated material.
36. The method according to embodiment 35 wherein the cleaning comprises contact with a cleaning agent having a chemical composition different from the lift-off agent, the cleaning agent comprising a fluorinated solvent.
37. The method according to any of embodiments 22-36 wherein at least one lift-off structure includes at least two patterned layers including a fluorinated material base layer and an overlying photoresist layer, the overlying photoresist layer provided from a photoresist composition comprising a fluorinated coating solvent.
38. The embodiment according to embodiment 37 wherein the photoresist layer comprises a fluorinated photoresist.
39. The embodiment according to embodiment 37 or 38 wherein the fluorinated material base layer includes a cyclic perfluorinated polymer and the fluorinated coating solvent is a hydrofluoroether.
40. The method according to any of embodiments 22-39 further including treating the top surface of patterned organic EL medium layers with a low work function metal or a substantially non-oxidizing plasma prior to deposition of the common top electrode, or alternatively, prior to deposition of a common organic EL layer if such layer is used.

41. A method of making an OLED device comprising:
a) providing a device substrate having a first array of bottom electrodes and a second array of bottom electrodes;
b) depositing second organic EL medium layers over the device substrate including over the first and second arrays of bottom electrodes, wherein the second organic EL medium layers include at least a second light-emitting layer;
c) providing over the second organic EL medium layers a first undercut lift-off structure having a first pattern of openings corresponding to the first array of bottom electrodes;
d) using the first undercut lift-off structure as an etch mask and removing common organic EL medium layers from areas over the first array of bottom electrodes;
e) depositing first organic EL medium layers including at least a first light-emitting layer over the first undercut lift-off structure and over the first array of bottom electrodes;
f) removing the first undercut lift-off structure and overlying first organic EL medium layers to form a first intermediate structure; and
g) providing a common top electrode in electrical contact with the first and second organic EL medium layers.
42. The method of embodiment 41 wherein at the first undercut lift-off structure includes at least two patterned layers including a fluorinated material base layer and an overlying photoresist layer wherein the fluorinated material base layer is undercut relative to the photoresist layer.
43. The method of embodiment 41 wherein the first undercut lift-off structure includes a patterned fluorinated photoresist developed using a fluorinated solvent and having an undercut profile.
44. The method according to any of embodiments 41-43 wherein the first undercut lift-off structure absorbs or blocks underlying layers from at least 80% of imaging radiation used in the formation of the lift-off structure.
45. The method according to any of embodiments 41-44 wherein the effective density of the first undercut lift-off structure with its corresponding overlying organic EL medium layers is less than the density of a lift-off agent used to remove the lift-off structure.
46. The method according to embodiment 45 wherein the lift-off agent comprises a fluorinated solvent.
47. The method according to any of embodiments 41-46 wherein the bottom electrodes act as cathodes and the common top electrode acts as a respective anode.
48. The method according to any of embodiments 41-47 wherein at least one top organic EL medium layer is deposited so that it covers the sidewalls of underlying organic EL medium layers.
49. The method according any of embodiments 41-48 further including vapor depositing a fluorinated material over the organic EL medium layers between steps (e) and (f).
50. The method according to any of embodiments 41-49 wherein the first undercut lift-off structures curls during its removal in a lift-off agent.
51. The method according to any of embodiments 41-50 further comprising depositing one or more common organic EL medium layers prior to depositing the common top electrode.
52. The method according to any of embodiments 41-51 further comprising, prior to depositing the common top electrode, or in the case of embodiment 51, prior to depositing the common organic EL layer, cleaning the intermediate structure of residual fluorinated material.
53. The method according to embodiment 52 wherein the cleaning comprises contact with a cleaning agent having a chemical composition different from the lift-off agent, the cleaning agent comprising a fluorinated solvent.
54. The method according to any of embodiments 41-53 wherein the first undercut lift-off structure includes at least two patterned layers including a fluorinated material base layer and an overlying photoresist layer, the overlying photoresist layer provided from a photoresist composition comprising a fluorinated coating solvent.
55. The method according to embodiment 54 wherein the photoresist layer comprises a fluorinated photoresist.
56. The method according to embodiment 54 or 55 wherein the fluorinated material base layer includes a cyclic perfluorinated polymer and the fluorinated coating solvent is a hydrofluoroether.
57. The method according to any of embodiments 41-56 further including treating the top surface of patterned organic EL medium layers with a low work function metal or a substantially non-oxidizing plasma prior to deposition of the common top electrode, or alternatively, prior to deposition of a common organic EL layer if such layer is used.
58. A method of making an organic device comprising:
a) over a device substrate, providing a first undercut lift-off structure having a first opening that forms an area of uncovered device substrate;
b) depositing a first active organic material layer over the first undercut lift-off structure and over a first portion of the area of uncovered device substrate;
c) depositing a second material layer over the first active organic material layer and over a second portion of the area of uncovered substrate thereby covering edge portions of the first active organic material layer; and
d) removing the first lift-off structure and overlying layers.
59. The method of embodiment 58 wherein the first active organic material layer includes an organic conductor, an organic semiconductor, a charge transport material, a light-emitting material, or a biological material.
60. The method of embodiment 59 wherein the first active organic material layer is vapor deposited in a reduced-pressure environment.
61. The method according to any of embodiments 58-60 wherein the second material layer is electrically conductive.
62. The method according to embodiment 61 wherein the second material layer comprises an organic conductor, a metal, a metal oxide, graphene or graphene-oxide.
63. The method according to any of embodiments 58-60 wherein the second material layer comprises a second active organic material.
64. The method of embodiment 63 wherein the second material layer includes an organic semiconductor, a charge transport material, a light-emitting material or a biological material.
65. The method according to any of embodiments 58-60 wherein the second material layer is later removed and does not form part of the organic device in its final form.
66. The method according to embodiment 65 wherein the second material layer includes a fluorinated material.

67. The method according to any of embodiments 58-66 wherein the second material layer is less sensitive to water or oxygen, or both, than the first active organic material layer.

68. The method according to any of embodiments 58-67 wherein the second material layer at least partially protects the first active organic material layer from water or oxygen or both.

69. The method according to any of embodiments 58-68 wherein the uncovered substrate comprises a bottom electrode in alignment with the first opening and the first active organic material layer completely covers the bottom electrode.

70. The method according to any of embodiments 58-69 wherein the first undercut lift-off structure includes at least two patterned layers including a fluorinated material base layer and an overlying photoresist layer wherein the fluorinated material base layer is undercut relative to the photoresist layer.

71. The method according to any of embodiments 58-69 wherein the first undercut lift-off structure includes a patterned fluorinated photoresist developed using a fluorinated solvent.

72. The method according to any of embodiments 58-71 wherein the organic device is an OLED, a display, a lighting device, a chemical sensor, a touch sensor, a photovoltaic, a TFT backplane, or a bioelectronic or medical device.

73. The method according to any of embodiments 58-72 wherein the device substrate is flexible.

74. The method according to any of embodiments 58-73 wherein the first opening is part of a first array of openings having a first pattern.

75. A method of patterning a device comprising:
a) providing a device substrate;
b) providing over the device substrate a fluorinated material layer comprising a first fluorinated material and providing a photoresist layer over the fluorinated material layer;
c) exposing and developing the photoresist layer to form a patterned photoresist;
d) transferring the photoresist pattern to the fluorinated material layer, thereby forming a first pattern of uncovered substrate;
e) depositing one or more material layers over the patterned photoresist and at least a portion of the uncovered substrate to form a first intermediate structure; and
f) contacting the first intermediate structure with a lift-off agent that dissolves the fluorinated material layer, thereby causing separation the patterned photoresist and overlying one or more layers, wherein the lift-off agent includes a fluorinated solvent and a film-forming second fluorinated material that may be the same as or different from the first fluorinated material.

76. The method according to embodiment 75 wherein the second fluorinated material forms a layer that covers the substrate including the one or more material layers deposited over the portion of uncovered substrate.

77. The method according to embodiments 76 further comprising providing a second photoresist over the layer of second fluorinated material.

78. The method according to any of embodiments 75-77 wherein the first and second fluorinated materials are substantially the same.

79. The method according to any of embodiments 75-78 wherein the fluorinated solvent is a hydrofluoroether.

80. A method of patterning an organic device comprising:
a) providing a device substrate;
b) providing over the device substrate a fluorinated material layer comprising a first fluorinated material and providing a photoresist layer over the fluorinated material layer;
c) exposing and developing the photoresist layer to form a patterned photoresist;
d) transferring the photoresist pattern to the fluorinated material layer, thereby forming a first pattern of uncovered substrate and a patterned fluorinated material layer having an undercut structure relative to the photoresist layer;
e) depositing one or more material layers over the patterned photoresist and at least a portion of the uncovered substrate to form a first intermediate structure; and
f) contacting the first intermediate structure with a lift-off agent that dissolves the fluorinated material layer, thereby causing separation the patterned photoresist and overlying one or more material layers, wherein the lift-off agent comprises a fluorinated solvent and the effective density of the patterned photoresist with its corresponding overlying material layers is less than the density of the lift-off agent.

81. The method of embodiment 80 wherein the patterned photoresist and overlying one or more material layers are selected to at least partially roll up and float away from the device substrate during step (f).

82. A method of making a device comprising:
a) over a device substrate, providing a first undercut lift-off structure having a first opening that forms an area of uncovered device substrate;
b) vapor depositing a first material layer over the first undercut lift-off structure and over a first portion of the area of uncovered device substrate;
c) vapor depositing a fluorinated material layer over the first material layer and optionally over a second portion of the area of uncovered substrate thereby optionally covering edge portions of the first material layer; and
d) removing the first lift-off structure and overlying layers by contact with a lift-off agent comprising a first fluorinated solvent that does not dissolve the vapor deposited fluorinated material layer thereby forming a first protected patterned structure having a patterned first material layer and an overlying patterned fluorinated material layer.

83. The method of embodiment 82 wherein the first protected patterned structure is subjected to one or more further patterning steps followed by removal of the patterned fluorinated material layer by contact with a removing agent comprising a second fluorinated solvent capable of dissolving the fluorinated material.

84. A full color OLED display comprising:
a substrate having a display region, the display region including an array of first, second and third organic EL elements, each array having individually patterned light-emitting layers for emission of differently colored light,
wherein each of the first organic EL elements is spaced 4 µm or less from a second or third organic EL element and a combined emissive area of all of the first, second and third organic EL elements is at least 60% of a total area occupied by the display region.

85. The OLED display of embodiment 84 wherein the substrate includes an active matrix backplane having an array of first, second and third bottom electrodes and a pixel definition layer formed in registration with the bottom electrodes.

86. The OLED display according to embodiment 84 or 85 further comprising an electron transporting layer that is commonly deposited over the separately patterned light-emitting layers, wherein the electron transporting layer contacts a different underlying patterned OLED material in each of the first, second and third arrays.

87. The OLED display according to any of embodiments 84-86 wherein material corresponding to the patterned light-emitting layer of the third organic EL element is also formed in interstitial non-emissive areas between the second and third organic EL elements.

88. A full color OLED display comprising:
a substrate having a display region, the display region including an array of first, second and third organic EL elements, each array having individually patterned light-emitting layers for emission of differently colored light, wherein the display region has an aperture ratio of greater than about 60% and a resolution of greater than about 600 ppi.

89. The OLED display of embodiment 88, wherein the aperture ratio is greater than about 70%.

90. The OLED display of embodiment 88 or 89, wherein the display region has a resolution of greater than about 700 ppi.

91. The OLED display according to any of embodiments 88-90, wherein the display region has a resolution of greater than about 800 ppi.

92. The OLED display according to any of embodiments 88-91 wherein each of the first, second and third organic elements are less than about 25 microns in size in any dimension.

93. The OLED display according to any of embodiments 88-92 wherein each of the first, second and third organic elements are less than about 15 microns in size in any dimension.

94. The OLED display according to any of embodiments 88-93 wherein each of the first, second and third organic elements are less than about 15 microns in size in any dimension.

95. The OLED display according to any of embodiments 88-94 wherein each of the first, second and third organic elements are less than about 5 microns in size in any dimension.

96. The OLED display according to any of embodiments 88-95, wherein the first, second and third organic EL elements emit red, green, and blue light, respectively.

97. The OLED display according to any of embodiments 88-96, wherein the combined emissive area of a first, second, and third organic EL element is less than about 1100 square microns.

98. The OLED display according to any of embodiments 88-97, wherein the combined emissive area of a first, second, and third organic EL element is less than about 500 square microns.

99. A full color OLED display comprising:
a substrate having a display region, the display region including an array of first, second and third sub-pixels, each array having individually patterned light-emitting layers for emission of differently colored light, wherein each of the first, second and third sub-pixels has a size of less than about 25 microns in any dimension and the display region has an aperture ratio of greater than about 60%.

100. The OLED display of embodiment 99, wherein the display region has a resolution of greater than about 600 ppi.

101. The OLED display of embodiment 99 or 100, wherein each of the first, second and third sub-pixels has a size of less than about 20 microns in any dimension.

102. The OLED display according to any of embodiments 99-101, wherein each of the first, second and third sub-pixels has a size of less than about 15 microns in any dimension.

103. The OLED display according to any of embodiments 99-102, wherein each of the first, second and third sub-pixels are spaced apart from each other by less than about 5 microns.

104. The OLED display according to any of embodiments 99-103, wherein the first, second and third sub-pixels comprise a unit cell having a display region area of less than about 1100 square microns.

EXAMPLES

Chemical structures of the OLED materials used in the following examples are shown below.

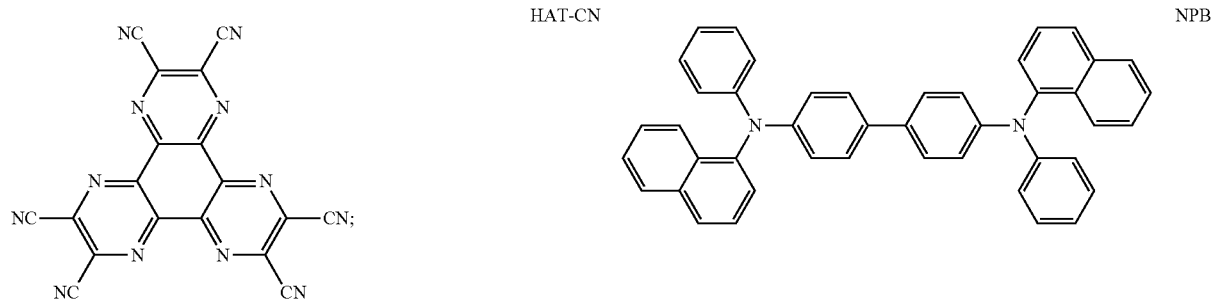

-continued

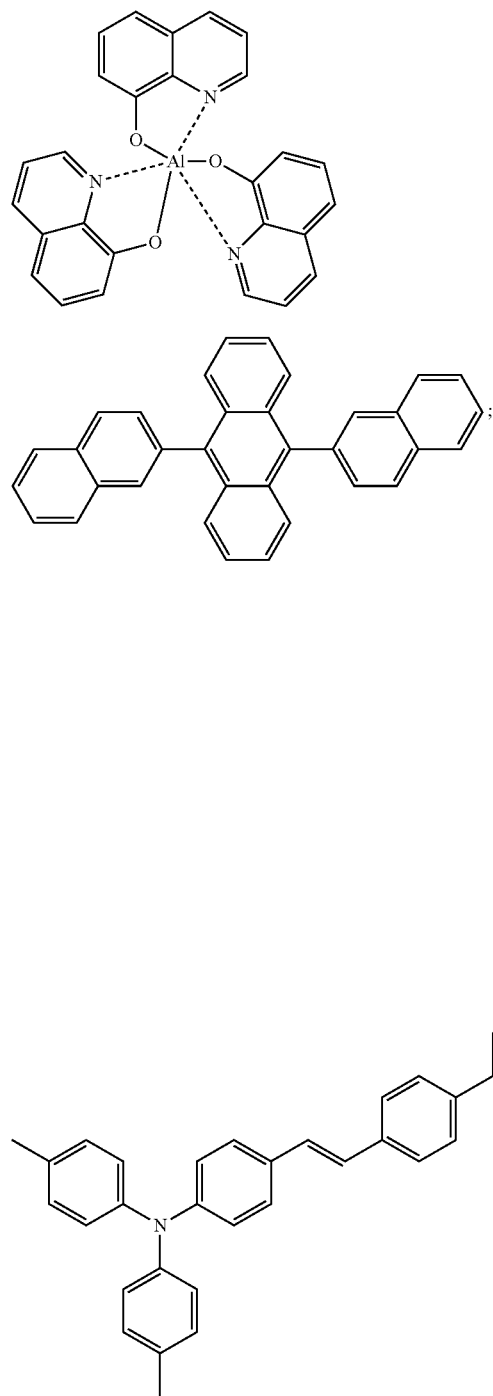

Alq

β-ADN

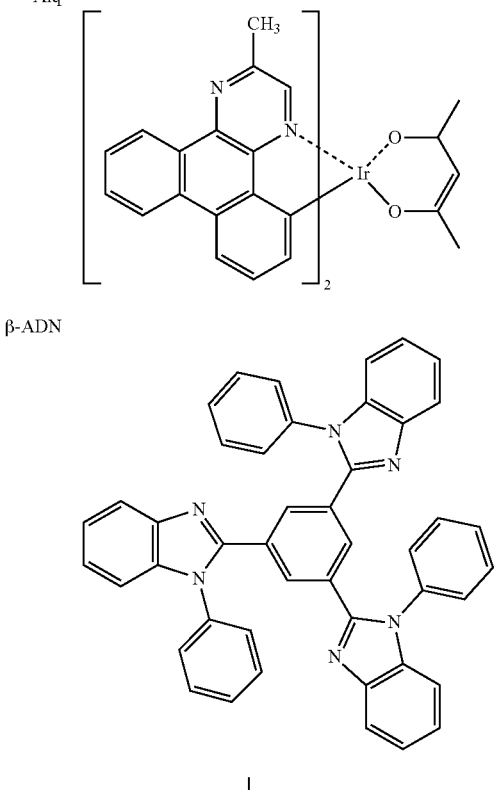

Ir(MDQ)$_2$(acac)

TPBi

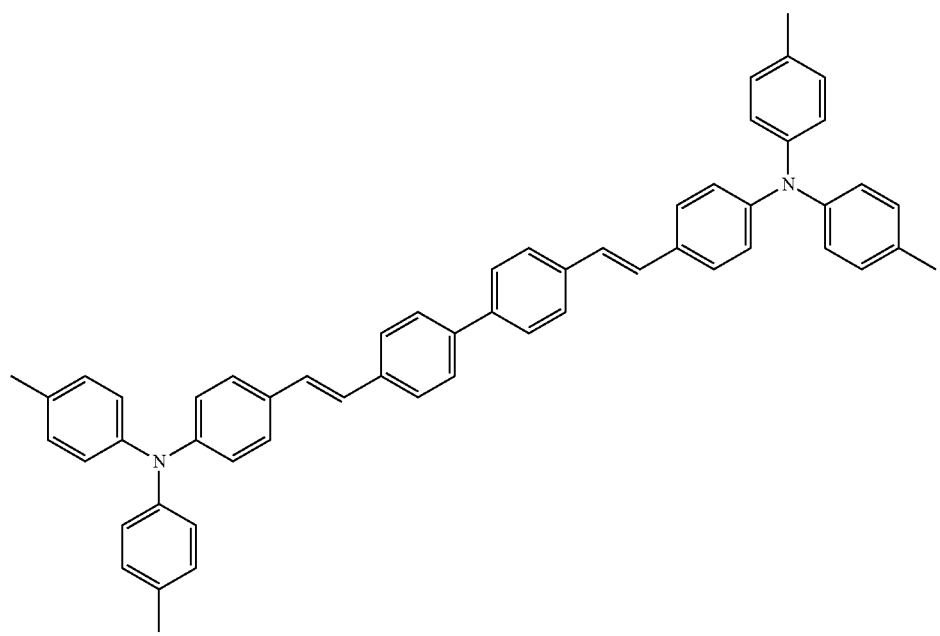

DPAVBi

Example 1

A glass substrate 800 was provided having three regions of conductive ITO as shown in FIG. 15A including center region 801 and two edge regions 802 and 802', each separated by stripes of non-conductive glass. In FIG. 15B, a patterned dielectric 803 was formed over a portion of center ITO from positive photoresist (AZ1512, diluted) by conventional methods and hard-baked at 150° C. for 5 minutes. An expanded view of the patterned dielectric 803' shows that the pattern included an array of vertical rows of 804G, 804R, and 804B openings for subsequently deposited green, red and blue OLED layers. The patterned dielectric was about 500 nm thick and had highly tapered features as depicted in FIG. 15B, which is a cross sectional look along cut line A-A of the expanded view. Referring back to FIG. 15A, each pixel opening was 10 μm wide and 36 μm long, each separated by 4 μm in the horizontal direction (between colors) and 6 μm in the vertical direction (between same color pixels). Thus, each set of RGB pixels is 40 μm×40 μm, which corresponds to a 635 dpi resolution color display with an emissive fill factor (aperture ratio) of 61%.

Patterning of green, red and blue OLED pixels was carried out in a manner similar to that described with respect to FIGS. 2 and 3. Rather than individually addressable bottom electrodes, however, a common anode (ITO) was provided as bottom electrode for all colors. Each lift-off structure was formed using a fluorinated material base layer and an overlying photoresist layer. The fluorinated material base layer was formed by coating a composition including a hydrofluoroether solvent with about 12% by weight of a methacrylate-based fluoropolymer having fluorine-containing pendant alkyl groups and non-fluorine containing pendant alkyl groups. The fluorine content of the fluoropolymer was about 49% by weight. The composition was spin coated over the substrate at 3000 rpm for 1 min and baked at 90° C. for 1 min on a hot plate. Thickness of the fluorinated material base layer was about 800 nm. This fluorinated material base layer had a planarizing effect over the patterned dielectric. In order to avoid difficulties in lift off, it was found that the thickness of fluorinated material base layer as measured from the ITO should be thicker than the height of the patterned dielectric, preferably at least 100 nm thicker.

Over the fluorinated material base layer, a conventional negative photoresist nLOF 2020 was applied by spin coating at 3500 rpm and baked at 110° C. for 1 min on a hot plate. The thickness of the photoresist was about 1.7 µm. The photoresist was then exposed on a Karl Suss contact aligner (365 nm) using a mask aligned with green pixels, the mask pixel features (openings) being about 1 µm larger in each dimension than the patterned dielectric openings. The exposure dose was 60 mJ/cm$^2$ and the structure was given a post exposure bake at 110° C. for 1 min on a hot plate. The nLOF was developed in CD-26 for 100-120 seconds, rinsed in DI water and blown dry with compressed air. The fluorinated material base layer was developed using two 30 sec "puddles" of HFE-7300 with spin drying after each 30 sec. A brief spray of HFE-7300 was also applied at the beginning of the spin dry to better remove the fluoropolymer from the pixel area.

The structure was then subjected to a mild oxygen plasma etch (50 sccm O$_2$, 100 mT pressure, 100 W, 30 sec) to remove trace fluorinated material residue in the pixel wells. An undercut of 1 or 2 µm in the fluorinated material base layer was clearly visible in a microscope.

The substrate with its lift-off structure was moved into an OLED deposition chamber and a green-emitting organic EL element was provided including vapor deposition of (in order) 10 nm HAT-CN, 80 nm NBP, 50 nm Alq, 0.5 nm LiF and 50 nm Al. The device was then moved into a nitrogen glove box and immersed in warm HFE7300 (between 50° C. and 60° C.) for a few minutes to dissolve the fluorinated material base layer. Lift off of the pixel patterned area occurred in less than 1 minute without agitation, although a large alignment mark area (not shown in FIG. 15) necessitated about 5 minutes with a small amount of agitation to remove the full structure. As lift-off was occurring, the photoresist portion with overlying OLED rolled up on itself thereby containing and reducing debris in solution. The lifted-off portion also tended to float to the surface of the lift-off bath due to its lower density making it relatively easy to remove. A pattern of OLEDs for green emission remained in the pixel areas corresponding to 804G in FIG. 15B.

The sample patterned with the green OLED pixels was removed from the lift-off bath, rinsed with HFE7300 and then coated with a new fluorinated base layer in nitrogen glove box. The sample was removed into the ambient, nLOF 2020 was applied and the subsequent steps were similar to those described above, but in this case, to form a red-emitting organic EL element in the pixel areas in a manner similar to described above, but now for the red pixels (corresponding to 804R in FIG. 15B). The red-emitting organic EL element included: 10 nm HAT-CN, 60 nm NBP, 40 nm of a 90:10 (by weight) mixture of NPB:Ir(MDQ)$_2$(acac), 20 nm Alq, 0.5 nm LiF and 50 nm Al.

The process was repeated again as previously described, but this time for the blue pixels corresponding to 804B in FIG. 15B. The blue-emitting organic EL element included 10 nm HAT-CN, 60 nm NBP, 40 nm of a 95:5 (by weight) mixture of β-ADN and DPAVBi, 20 nm Alq and 0.5 nm LiF. In this case, no aluminum was provided. The structure was treated in lift-off bath as previously described, rinsed with HFE-7300 and returned to OLED deposition chamber and a common aluminum cathode 805 was deposited over all of the OLED pixels as shown in FIG. 15C. The common cathode made contact with the end ITO stripes 802 and 802' so that they could be used as contacts.

The OLED device was encapsulated in a metal can. No attempt was made to balance the voltage between the OLED structures and not all of the pixels turned on at the same time as voltage was applied to the structure, but all three pixels arrays lit up brightly at 12V thus showing that a full-color OLED device can be fabricated having resolution of >630 dpi and an emissive fill factor (aperture ratio) of >60% with a spacing of only 4 µm between red, green and blue pixels.

Example 2

This example was similar to Example 1, but with some notable changes. The processing sequence for Example 2 was similar to that shown in FIGS. 6 and 7. The fluorinated material base layer was 900 nm Cytop 109A coated from a hydrofluoroether solvent and the photoresist was a negative tone, branched photosensitive fluoropolymer coated 1.2 µm from an HFE solvent similar to those described in U.S. application Ser. No. 14/539,574. The fluoropolymer included fluorine-containing alkyl groups, acid-catalyzed, carboxylic acid forming precursor groups, sensitizing dye units, acid quenching units and had a fluorine content of about 40% by weight. The coating composition further included a photoacid generating compound CGI-1907 at 1% by weight relative to the fluoropolymer. The photosensitive fluoropolymer has high solubility in HFE-7600. The authors have surprisingly found that Cytop has low solubility in HFE-7600, thereby enabling easy coating of the photosensitive fluoropolymer over the Cytop. Other investigators have shown that coating of conventional photoresists is difficult over Cytop due to dewetting, but the authors have found that the photosensitive fluoropolymer from HFE-7600 coats very well and overcomes a significant problem. Further, the photosensitive fluoropolymer was surprisingly much less prone to dirt contamination relative to nLOF resulting in fewer defects.

The photosensitive fluoropolymer was exposed at 14 mJ/cm$^2$ (post apply and post exposure bakes done for 1 min at 90° C.) and was developed with a few second puddle of HFE-7100 which rapidly dissolves unexposed areas but not underlying Cytop. The underlying Cytop development and other lift-off structure processing steps were similar to those described previously. As lift-off was occurring, the fluorinated photopolymer portion with overlying OLED rolled up on itself thereby containing and reducing debris in solution.

The lifted-off portion also tended to float to the surface of the lift-off bath due to its lower density making it relatively easy to remove.

With respect to the OLED stacks, the first pixel included (in order) 10 nm HAT-CN, 60 nm NBP, and 40 nm of a 90:10 (by weight) mixture of NPB:Ir(MDQ)$_2$(acac). The second pixel included 10 nm HAT-CN and 80 nm of NPB. The third pixel included 10 nm HAT-CN, 60 nm NPB, 40 nm of a 95:5 (by weight) mixture of β-ADN and DPAVBi. After the final lift-off following the third pixel deposition, a common layer of 30 nm Alq electron tranpsort layer was deposited over all of the pixels followed by a common layer of 0.5 nm LiF and 100 nm Al. For the second pixel, the common Alq layer produced a green-emitting EL element.

This device had fewer defects and shorts, in part because of the photosensitive fluoropolymer and in part because of the common Alq layer reducing the number of shorts. Again, no attempt was made to balance the voltage between the OLED structures and not all of the pixels turned on at the same time as voltage was applied to the structure. First and second pixels lit up at 2.5 V and were very bright by 5 V. The third pixel turned on at about 8 volts and all were brightly lit at about 10 V. For reasons unknown, the first pixel emitted bright green light rather than red. In any event, a patterned color OLED device having very high resolution was again demonstrated. Relative to Example 1, Example 2 had additional advantages that the turn on voltages were substantially reduced, fewer defects were observed and less shorting occured.

The present disclosure enables a broad set of active organic materials to be photolithographically patterned to fine dimensions. Because special "photoresist compatible" OLED materials do not need to be selected, the user is free to use the best OLED materials to create the most effective structures possible for red, green and blue emission.

LIST OF REFERENCE NUMBERS USED IN THE DRAWINGS

10 OLED Device
11 anode
12 hole-injecting layer (HIL)
13 hole-transporting layer (HTL)
14 electron-blocking layer (EBL)
15 light-emitting layer (LEL)
16 hole-blocking layer (HBL)
17 electron-transporting layer (ETL)
18 electron-injecting layer (EIL)
19 cathode
20 organic EL medium
101 form first lift-off structure step
103 clean residue step
105 deposit first organic EL medium step
107 deposit first top electrode step
109 remove first lift-off structure step
111 form second lift-off structure step
113 clean residue step
115 deposit second organic EL medium step
117 deposit second top electrode step
119 remove second lift-off step
121 form third lift-off structure step
123 clean residue step
125 deposit third organic EL medium step
127 deposit third top electrode step
129 remove third lift-off structure step
131 deposit common top electrode step
200 OLED substrate
201 support
202 TFT layer portion
203 electrode-separating dielectric
210 first bottom electrode
211 first lift-off structure
212 first material layer
213 first patterned photoresist layer
214 undercut region
215 opening
216 first organic EL medium layers
216' first organic EL medium layers
217 first top electrode
217' first top electrode
218 first intermediate structure
220 second bottom electrode
221 second lift-off structure
222 second material layer
222A lift-off fluorinated material layer
223 second patterned photoresist layer
224 undercut region
225 opening
226 second organic EL medium layers
226' second organic EL medium layers
227 second top electrode
227' second top electrode
228 second intermediate structure
230 third bottom electrode
231 third lift-off structure
232 third material layer
233 third patterned photoresist layer
234 undercut region
235 opening
236 third organic EL medium layers
236' third organic EL medium layers
237 third top electrode
237' third top electrode
238 third intermediate structure
240 common top electrode
241 thin common top electrode
242 common top electrode
250 active matrix OLED device
251 defective active matrix OLED device
252 active matrix OLED device
301 form base layer step
303 form photoresist layer step
305 expose the photoresist layer step
307 develop the exposed photoresist layer step
309 remove first pattern of uncovered base layer step
310 device substrate
311 base layer
312 photoresist layer
313 radiation source
314 photomask
315 exposed photoresist layer
316 pattern of exposed photoresist regions
317 pattern of unexposed photoresist regions
318 first pattern of uncovered base layer
319 lift-off structure
320 first pattern of openings
321 undercut regions
401 form first lift-off structure step
403 clean residue step
405 deposit first organic EL medium step
409 remove first lift-off structure step
411 form second lift-off structure step
413 clean residue step
415 deposit second organic EL medium step 419 remove second lift-off structure step
421 form third lift-off structure step
423 clean residue step
425 deposit third organic EL medium step
429 remove third lift-off structure step
430 deposit one or more common organic EL medium layers step
431 deposit common top cathode step
440 first organic EL medium layers
442 second organic EL medium layers
444 third organic EL medium layers
446 common EIL layer
448 common cathode layer
450 active matrix OLED device
480 top electrode source
482 top electrode material
490 vapor deposited fluorinated material
490' vapor deposited fluorinated material
495 patterned dielectric
501 deposit third organic EL medium layers step
503 form first lift-off structure step
505 etch third organic EL medium layers step
507 deposit first organic EL medium layers step
509 remove first lift-off structure step
511 form second lift-off structure step
513 etch third organic EL medium layers step
515 deposit second organic EL medium layers step
517 remove second lift-off structure step
519 deposit one or more common organic EL medium layers step
521 deposit common top electrode step
611 first lift-off structure
612 first material layer
613 first patterned photoresist layer
614 undercut region
615 opening
616 first organic EL medium layers
616' first organic EL medium layers
618 first intermediate structure
621 second lift-off structure
622 second material layer
623 second patterned photoresist layer
624 undercut region
625 opening
626 second organic EL medium layers
626' second organic EL medium layers
628 second intermediate structure
636 third organic EL medium layers
636' removed portion of third organic EL medium layers
636" removed portion of third organic EL medium layers
646 one or more common organic EL medium layers
648 common electrode
650 active matrix OLED device
701 device substrate
703 area of uncovered device substrate
705 first portion of area of uncovered device substrate
707 second portion of area of uncovered device substrate
711 first undercut lift-off structure
713 first active organic material layer
713' first active organic material layer
715 first opening
717 second material layer
717' second material layer
720 organic device
800 glass substrate
801 center region of ITO
802 edge region of ITO
802' edge region of ITO
803 patterned dielectric
803' patterned dielectric
804G opening for green OLED layers
804R opening for red OLED layers
804B opening for blue OLED layers
805 common cathode

The invention claimed is:

1. A method of making an OLED device comprising:
    a) providing a device substrate having a first array of bottom electrodes, a second array of bottom electrodes and a third array of bottom electrodes;
    b) depositing third organic EL medium layers over the device substrate including over the first, second and third arrays of bottom electrodes, wherein the third organic EL medium layers include at least a third light-emitting layer;
    c) providing over the third organic EL medium layers a first undercut lift-off structure having a first pattern of openings corresponding to the first array of bottom electrodes;
    d) using the first undercut lift-off structure as an etch mask and removing by dry etching the third organic EL medium layers from areas over the first array of bottom electrodes;
    e) depositing first organic EL medium layers including at least a first light-emitting layer over the first undercut lift-off structure and over the first array of bottom electrodes;
    f) removing the first undercut lift-off structure and overlying first organic EL medium layers by treatment with a lift-off agent comprising a fluorinated solvent to form a first intermediate structure;
    g) providing over the first intermediate structure a second undercut lift-off structure having a second pattern of openings corresponding to the second array of bottom electrodes;
    h) using the second undercut lift-off structure as an etch mask and removing by dry etching the third organic EL medium layers from areas over the second array of bottom electrodes;
    i) depositing second organic EL medium layers including at least a second light-emitting layer over the second undercut lift-off structure and over the second array of bottom electrodes;
    j) removing the second undercut lift-off structure and overlying second organic EL medium layers by treatment with a lift-off agent comprising a fluorinated solvent to form a second intermediate structure; and
    k) depositing a common top electrode over the second intermediate structure in electrical contact with the first, second and third organic EL medium layers.

2. The method of claim 1, wherein at least one undercut lift-off structure comprises two patterned layers including a fluorinated material base layer and an overlying photoresist layer wherein the fluorinated material base layer is undercut relative to the photoresist layer.

3. The method of claim 1, wherein at least one undercut lift-off structure comprises a patterned fluorinated photoresist developed using a fluorinated solvent and having an undercut profile.

4. The method of claim 1, wherein at least one undercut lift-off structure comprises two patterned layers including a fluorinated material base layer and an overlying fluorinated photoresist layer, the overlying fluorinated photoresist layer provided from a photoresist composition comprising a fluorinated coating solvent.

5. The method of claim 4, wherein the fluorinated material base layer comprises a cyclic perfluorinated polymer and the fluorinated coating solvent comprises a hydrofluoroether.

6. The method of claim 1, further comprising cleaning the second intermediate structure of residual fluorinated material prior to depositing the common top electrode, wherein the cleaning comprises contact with a cleaning agent having a chemical composition different from the lift-off agent, the cleaning agent comprising a fluorinated solvent.

7. The method of claim 1, wherein the third organic EL medium layers do not include substantial amounts of metal-containing materials.

8. The method of claim 1, wherein the bottom electrodes act as cathodes and the common top electrode acts as a respective anode.

9. The method of claim 1, further comprising depositing one or more common organic EL medium layers over the second intermediate structure prior to depositing the common top electrode.

* * * * *